(12) United States Patent
David et al.

(10) Patent No.: US 8,378,724 B2
(45) Date of Patent: Feb. 19, 2013

(54) CONTROLLING A FREQUENCY LOCKED LOOP

(75) Inventors: Thomas S. David, Austin, TX (US);
Kenneth W. Fernald, Austin, TX (US);
Alan L. Westwick, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 46 days.

(21) Appl. No.: 12/976,298

(22) Filed: Dec. 22, 2010

(65) Prior Publication Data

US 2012/0161835 A1    Jun. 28, 2012

(51) Int. Cl.
*H03L 7/06*    (2006.01)
(52) U.S. Cl. ......... 327/157; 327/148; 327/149; 327/158
(58) Field of Classification Search .................. 327/148, 327/149, 157, 158
See application file for complete search history.

(56) References Cited

U.S. PATENT DOCUMENTS

| | | | |
|---|---|---|---|
| 7,676,686 B2* | 3/2010 | Ku et al. ........................ | 713/600 |
| 8,049,544 B2* | 11/2011 | Hong et al. ................... | 327/158 |
| 8,130,015 B2* | 3/2012 | Miyano ......................... | 327/156 |
| 8,149,036 B2* | 4/2012 | Seo ............................... | 327/175 |
| 2007/0069781 A1* | 3/2007 | Kim et al. ..................... | 327/158 |
| 2009/0045858 A1* | 2/2009 | Hur ............................... | 327/158 |
| 2009/0256604 A1* | 10/2009 | Ku ................................ | 327/158 |
| 2011/0001526 A1* | 1/2011 | Hong et al. ................... | 327/158 |
| 2012/0081161 A1* | 4/2012 | Shin ............................. | 327/158 |
| 2012/0154001 A1* | 6/2012 | Seo ............................... | 327/158 |
| 2012/0161835 A1* | 6/2012 | David et al. .................. | 327/157 |

\* cited by examiner

*Primary Examiner* — Adam Houston
(74) *Attorney, Agent, or Firm* — Trop Pruner & Hu, P.C.

(57) ABSTRACT

An apparatus includes a frequency locked loop and a controller. The controller stores a state of the frequency locked loop at which an output signal of the frequency locked loop is locked onto a reference signal and subsequently initializes the frequency locked loop with the stored state to cause the frequency locked loop to relock the output signal to the reference signal.

22 Claims, 17 Drawing Sheets

CONTROLLING A FREQUENCY LOCKED LOOP

BACKGROUND

The disclosure generally relates to controlling a frequency locked loop.

A frequency locked loop (FLL) typically is used for purposes of generating a signal that is synchronized, or "locked," in frequency and/or phase to a reference signal. For example, when the FLL is locked, the frequency of the FLL's output signal may be a specified multiple of the frequency of the reference signal; and the output signal may have a specific phase relationship to the phase of the reference signal. A frequency locked loop which also locks the phase of the output signal to the phase of the reference signal is also known as a phase locked loop (PLL).

A conventional FLL may include a voltage controlled oscillator (VCO), which generates the FLL's output signal. The VCO's frequency typically is regulated to achieve lock through the use of a feedback loop, which controls the VCO based on a comparison of the output signal with the reference signal. Often, the output signal and the reference signal are divided in frequency before making the comparison. A typical FLL may include a phase detector that compares the phase of the FLL's output signal with the reference signal and controls a charge pump accordingly. The signal that is produced by the charge pump typically is filtered through a loop filter to produce a control signal that regulates the frequency of the VCO.

SUMMARY

In an exemplary embodiment, a technique includes storing a state of a frequency locked loop when the frequency locked loop is locked onto a reference signal; and subsequently initializing the frequency locked loop with the stored state to cause the frequency locked loop to relock the output signal to the reference signal.

In another exemplary embodiment, an apparatus includes a frequency locked loop and a controller. The controller stores a state of the frequency locked loop at which an output signal of the frequency locked loop is locked onto a reference signal and subsequently initializes the frequency locked loop with the stored state to cause the frequency locked loop to relock the output signal to the reference signal.

In yet another exemplary embodiment, an apparatus includes an integrated circuit, which includes a frequency locked loop, a memory and a controller. The controller is adapted to store a state of the frequency locked loop at which an output signal of the frequency locked loop is locked onto a reference signal and subsequently initialize the frequency locked loop with the stored state to cause the frequency locked loop to relock the output signal to the reference signal.

Advantages and other features of the invention will become apparent from the following drawing, description and claims.

DETAILED DESCRIPTION

Figure 1:
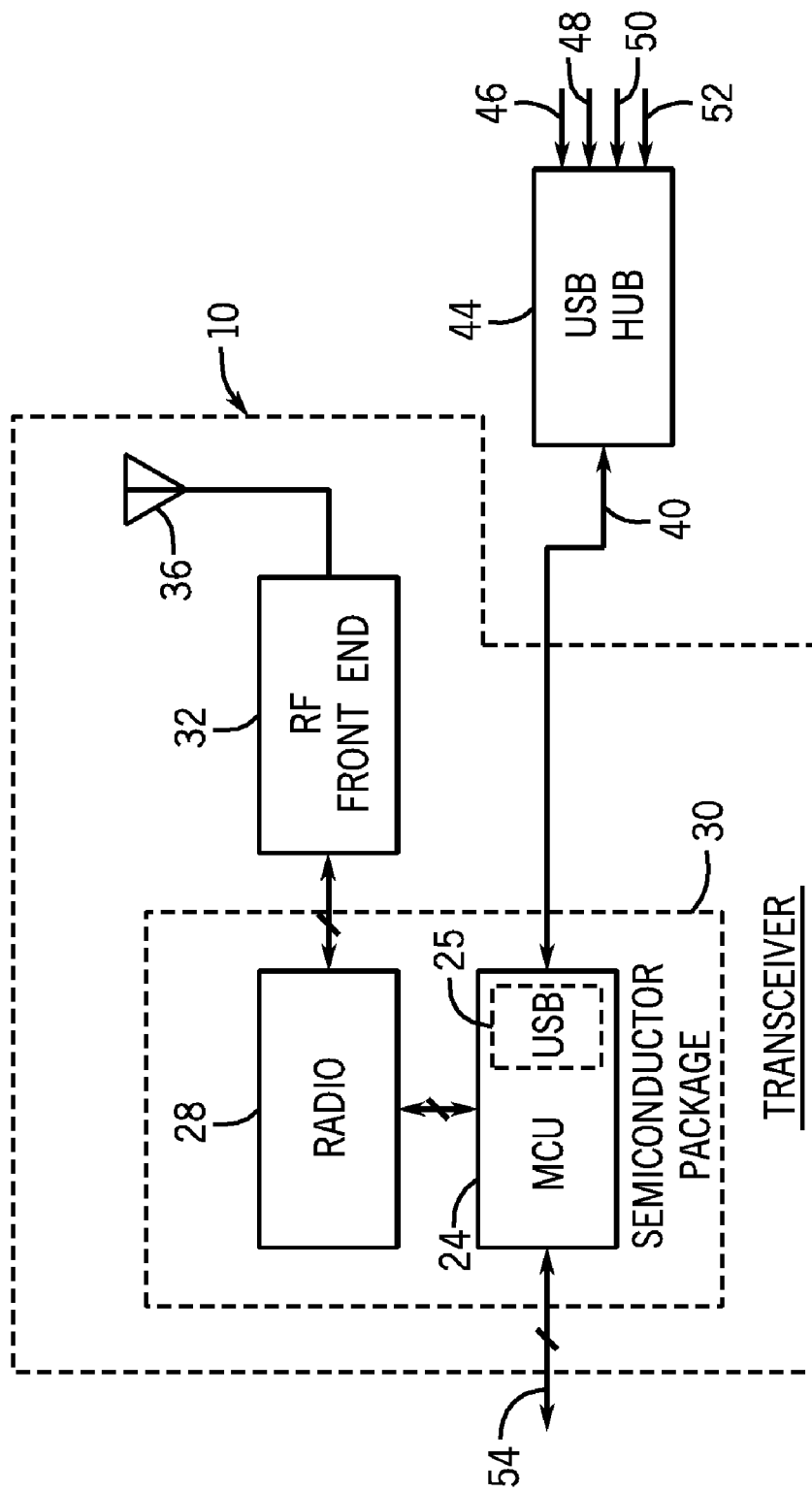
FIG. 1 is a schematic diagram of a transceiver system according to an embodiment of the invention.

Referring to FIG. 1, in accordance with embodiments of the invention disclosed herein, a microcontroller unit (MCU) 24 may be used in a variety of applications, such as applications in which the MCU 24 controls various aspects of a transceiver 10 (as a non-limiting example). In this regard, the MCU 24, for this particular example, may be part of an integrated circuit (IC), or semiconductor package 30, which also includes a radio 28. As a non-limiting example, the MCU 24 and the radio 28 may collectively form a packet radio, which processes incoming and outgoing streams of packet data. To this end, the transceiver 10 may further include a radio frequency (RF) front end 32 and an antenna 36, which receives and transmits RF signals (frequency modulated (FM) signals, for example) that are modulated with the packet data.

As non-limiting examples, the transceiver 10 may be used in a variety of applications that involve communicating packet stream data over relatively low power RF links and as such, may be used in wireless point of sale devices, imaging devices, computer peripherals, cellular telephone devices, etc. As a specific non-limiting example, the transceiver 10 may be employed in a smart power meter which, through a low power RF link, communicates data indicative of power consumed by a particular load (a residential load, for example) to a network that is connected to a utility. In this manner, the transceiver 10 may transmit packet data indicative of power consumed by the load to mobile meter readers as well as to an RF-to-cellular bridge, for example. Besides transmitting data, the transceiver 10 may also receive data from the utility or meter reader for such purposes (as non-limiting examples) as inquiring as to the status of various power consuming devices or equipment; controlling functions of the smart power meter; communicating a message to a person associated with the monitored load, etc.

As depicted in FIG. 1, in addition to communicating with the radio 28, the MCU 24 may further communicate with other devices and in this regard may, as examples, communicate over communication lines 54 with a current monitoring and/or voltage monitoring device of the smart power meter as well as communicate with devices over a Universal Serial Bus (USB) 40. For example, various USB links 46, 48, 50 and 52 may communicate via a hub 44 and USB 40 with the transceiver 10 for such purposes as communicating with a residential computer regarding power usage of various appliances, communicating with these appliances to determine their power usages, communicating with the appliances to regulate their power usages, etc. For purposes of communicating with the USB 40, the MCU 24 has an integrated USB interface 25, in accordance with some embodiments of the invention.

Figure 2:
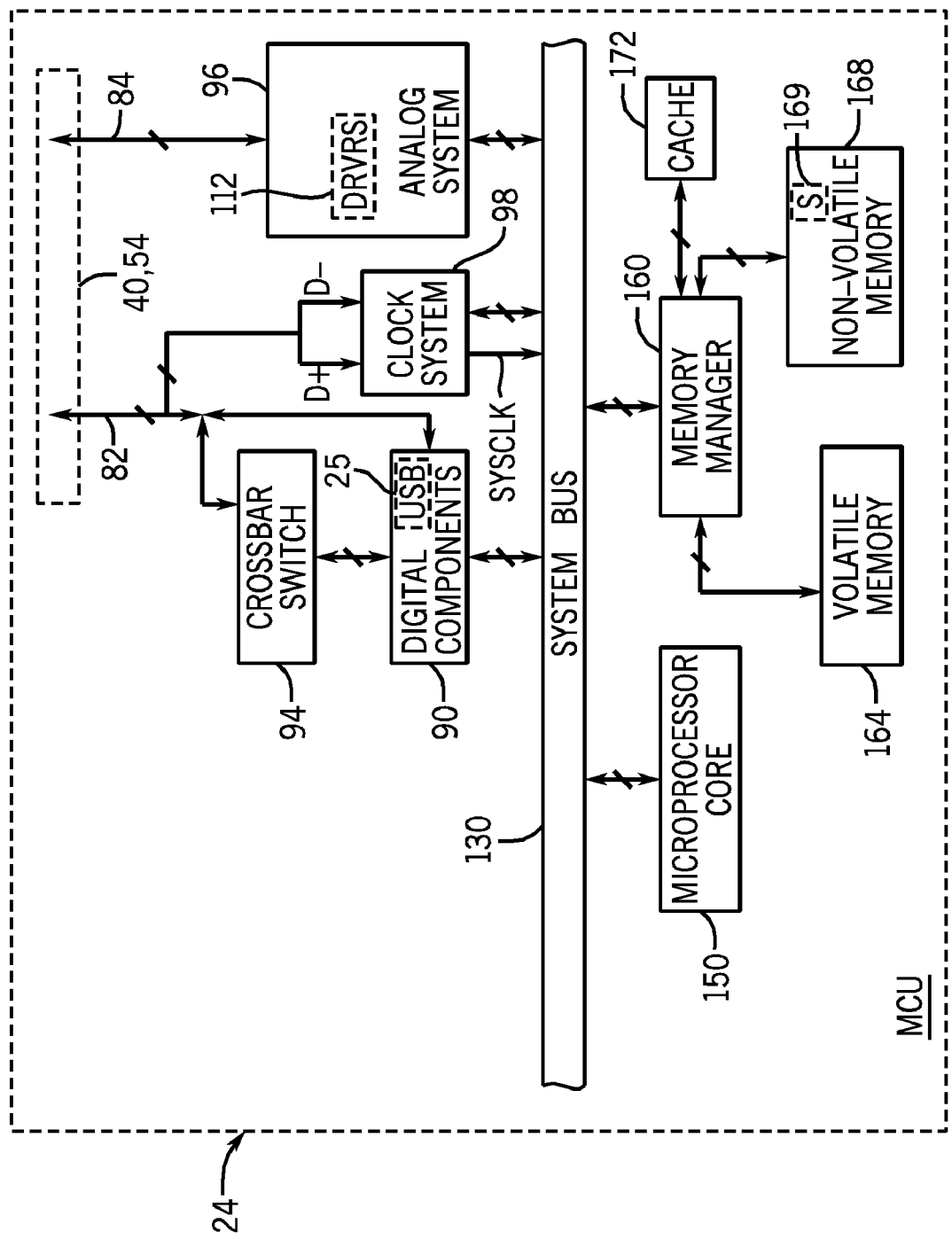
FIG. 2 is a schematic diagram of a microcontroller unit according to an embodiment of the invention.

In accordance with embodiments of the invention, the MCU 24 is a "system on a chip," which includes various components, such as the components that are depicted in FIG. 2, which may be fabricated on the same die. Referring to FIG. 2, among these components, the MCU 24 includes a processor core 150. As a non-limiting example, the processor core 150 may be a 32-bit core, such as the Advanced RISC Machine (ARM) processor core, which executes a Reduced Instruction Set Computer (RISC) instruction set. In general, the processor core 150 communicates with various other system components of the MCU 24, such as a memory controller, or manager 160, over a system bus 130. In general, the memory manager 160 controls access to various memory components of the MCU 24, such as a cache 172, a non-volatile memory 168 (a Flash memory, for example) and a volatile memory 164 (a static random access memory (SRAM), for example).

The MCU 24 also includes various digital peripheral components 90, such as (as non-limiting examples) the USB interface 25, a programmable counter/timer array (PCA), a universal asynchronous receiver/transmitter (UART), a system management bus (SMB) interface, a serial peripheral interface (SPI), etc. The MCU unit 24 may include a crossbar switch 94, which permits the programmable assigning of the digital peripheral components 90 to digital output terminals 82 of the MCU 24. In this regard, the MCU 24 may be selectively configured to selectively assign certain output terminals 82 to the digital peripheral components 90.

In accordance with embodiments of the invention, the MCU 24 also includes an analog system 96, which includes various interfaces to analog terminals 84 of the MCU 24. For example, the analog system 96 may include various components that receive analog signals, such as analog-to-digital converters (ADCs), comparators, etc. Moreover, the analog system 96 may include such other components as one or more low dropout (LDO) converters and one or more current drivers 112, which may be generally controlled by software of the MCU 24.

Figure 3:
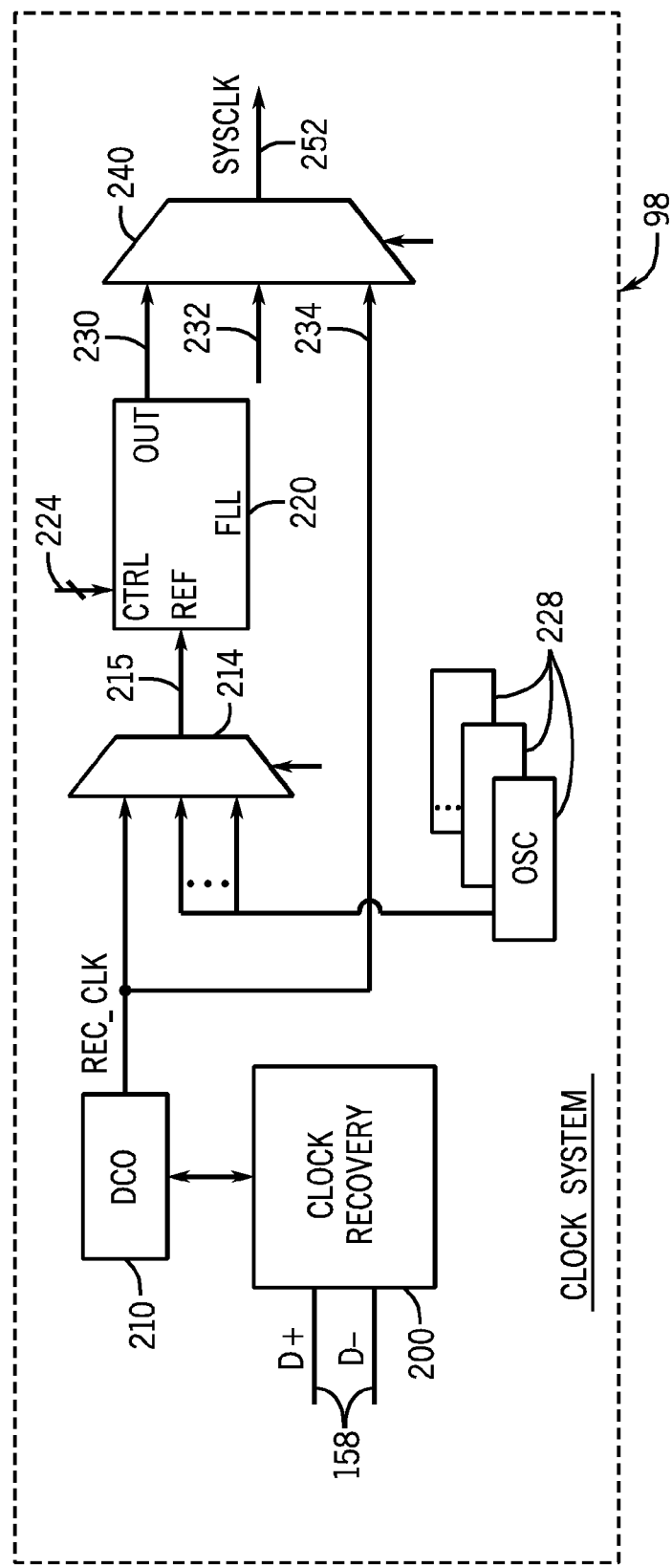
FIG. 3 is a schematic diagram of a clock system of the microcontroller unit of FIG. 2 according to an embodiment of the invention.

The MCU 24 also includes a clock system 98, which supplies one or more system clock signals (one of which is called "SYSCLK" in FIG. 2) to the system bus 130, which is used to clock operations, for example, of the processor core 150. Referring to FIG. 3, in accordance with some embodiments of the invention, the clock system 98 may be configured by the processor core 150 to select one of a number of different sources for the SYSCLK system clock signal, such as the clock signals that are generated by relatively low and high frequency oscillators 228 (crystal-based as well as resistor-capacitor (RC)-based oscillators, for example), as well as a clock signal (called the "REC_CLK" reference clock signal herein) that a clock recovery circuit 200 of the system 98 recovers from the bursty data communications that occur on the USB 40. In this manner, the clock recovery circuit 200 receives data signals (labeled as the "D+" and "D-" in FIG. 3) from the USB 40, and from these signals, the clock recovery circuit 200 extracts the relatively high accuracy (within one quarter percent of the nominal USB clock frequency) clock signal from the USB 40.

In addition to imparting the ability to select the clock sources that are set forth above, the clock system 98 also permits the REC_CLK reference clock signal to be used as a reference to a frequency locked loop (FLL) 220 for purposes of generating a SYSCLK system clock signal that has a frequency different from the frequency of the REC_CLK reference clock signal. In the context of this application, the language "frequency locked loop" means a circuit that locks onto the frequency of a reference signal to produce a corresponding output signal whose frequency has a predefined relationship with respect to the frequency of the reference signal. In the context of this application, the term "reference signal," unless otherwise specifically defined, refers to either an undivided reference signal or a divided reference signal. Also, in the context of this application, unless otherwise specifically defined, the term "output signal" means an undivided output signal or a divided output signal. In the clock system 98, the FLL 220 generates an output clock signal (provided at terminal 230), which has a frequency that is scaled by N/M, where "N" and "M" are both integers that are programmable (via terminals 224) by the processor core 150 or another component, for example. Thus, depending on the values of N and M, the output clock frequency of the FLL 220 may be greater than, equal to or less than the frequency of the REC_CLK reference clock signal. In accordance with other embodiments of the invention, N and M may not be restricted to integer values. Thus frequency dividers that support fractional divide values may be used and are within the scope of the appended claims.

In addition to locking onto the frequency of the REC_CLK reference clock signal, the FLL 220 may further function as a phase locked loop (PLL), in which the FLL 220 establishes a predefined phase offset between the output clock signal and the REC_CLK reference clock signal. Although frequency locking may establish a fixed phase offset between the REC_CLK and output clock signals, the PLL mode of the FLL 220 permits the precise phase offset to be controlled. For example, in accordance with some embodiments of the invention, the FLL 220 establishes a substantially zero phase offset such that logic level transitions resulting in rising, or positive, edges of the REC_CLK reference clock signal are aligned in time with positive edges of the output clock signal. The FLL 220 may establish other predefined phase offsets, other than a zero phase offset, in accordance with other embodiments of the invention.

As depicted in FIG. 3, in accordance with some embodiments of the invention, the FLL 220 has a reference terminal 215 that, depending on the selection by a multiplexer 214, receives the REC_CLK reference clock signal or another reference clock signal, such as one of a number of clock signals that are provided by the oscillators 228, for example.

In addition to allowing selectable reference clock signals for the FLL 220, the clock system 98 also permits the selection of other clock signals for the SYSCLK system clock signal. In this manner, as depicted in FIG. 3, the SYSCLK system clock signal is provided at an output terminal 252 of a multiplexer 240, which is controlled by the processor core 150, for example. In this regard, depending on the particular selection signals that are received by the multiplexer 240, the multiplexer 240 may select the output clock signal provided by the FLL 220 as well as REC_CLK reference clock signal. Moreover, as depicted in FIG. 3, the multiplexer 240 may have additional input terminals, such as input terminal 232, which receives at least one additional input clock source signal, such as a signal that is generated by a crystal-based oscillator, for example.

Referring to FIG. 3 in conjunction with FIG. 2, in certain applications, the MCU 24 may temporarily enter a lower power consumption state in which the FLL 220 is disabled to conserve power; and thereafter, the MCU 24 may transition back to a higher power consumption state and re-enable the FLL 220. For example, the MCU 24 may process packets of data that are received and transmitted by the radio 28 (see FIG. 1). During periods of time in which the MCU 24 is not processing the packet data, the processing activity of the MCU 24 may be relatively low, and as such, the MCU 24 may enter a lower power conservation state in which the MCU 24 operates at a lower system clock frequency and certain components of the MCU 24 are powered down. Thus, as non-limiting examples, when the MCU 24 has completed processing packet data to be transmitted by the radio 28 or when the MCU 24 has processed all recently received packet data and the radio 28 is no longer receiving packet data, the MCU 24 may operate at a lower system clock frequency. For the lower power consumption state, the processor core 150 configures the clock system 98 to select a lower frequency clock source for the system clock other than the FLL 220 and disables the FLL 220. The disabling of the FLL 220 may involve disabling the FLL's oscillator, in accordance with some embodiments of the invention.

Continuing the example, while the MCU 24 is in the lower power consumption state, the radio 28 may subsequently receive packet data, which is to be processed by the MCU 24. To prepare for this processing, the processor core 150 may reconfigure the clock system 98 to supply a higher frequency system clock signal. The MCU 24 may rely on the FLL 220 for providing the higher frequency system clock signal, and therefore, the processor core 150 may re-enable the FLL 220 and its oscillator.

When re-enabled, however, the FLL 220 may not instantly lock onto its reference signal, but rather the FLL 220 may take a significant amount of time to achieve frequency locking and possibly phase locking (if desired). The smaller the FLL lock time, the faster the MCU 24 may begin processing the packet data, which translates to less time in the higher power consumption state and thus, less overall power consumption for the MCU 24.

Figure 4:
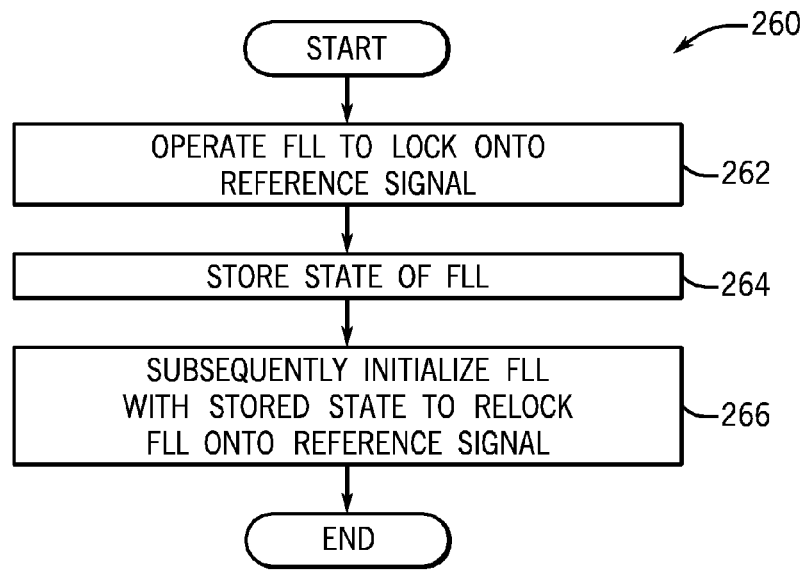
FIG. 4 is a flow diagram depicting a technique to control a frequency locked loop according to an embodiment of the invention.

Referring to FIG. 4 in conjunction with FIGS. 2 and 3, in accordance with embodiments of the invention described herein, the MCU 24 performs a technique 260 for purposes of improving the lock time of the FLL 220. In generally, the FLL 220 may substantially relock to the reference signal when, for example, the FLL 220 is re-enabled after being disabled or when the programmable target frequency of the FLL 220 changes (as further described below). As a non-limiting example, the FLL 220 is substantially locked or substantially re-locked to the reference signal when at least the frequency of the FLL 220 is within ten percent of the frequency where exact locking occurs. The technique 260 takes advantage of the FLL's operation at a previous time in which the FLL 220 was locked onto a reference signal, pursuant to block 262. In this manner, a state of the FLL 220 for this previous time has been stored, pursuant to block 264, so that when the FLL 220 is re-enabled, the FLL 220 may be initialized with the stored state for purposes of minimizing the relocking time of the FLL 220, pursuant to block 266.

Because the FLL 220 is initialized with the stored state, the FLL 220 may rapidly relock onto the reference signal within one or two cycles of the reference clock signal, in accordance with some embodiments of the invention. Moreover, in accordance with some embodiments of the invention, because the FLL 220 is initialized with the previously stored state, the MCU 24 may immediately use the FLL's output clock signal as the system clock signal after the FLL 220 is enabled, without waiting for locking to occur. Moreover, in accordance with some embodiments of the invention, the FLL 220 may be initialized with a previously stored state and then operate in an open-loop mode in which the FLL 220 continues to operate at substantially the previously stored state, allowing the MCU to immediately use the FLL's output clock signal as the system clock without requiring that the FLL 220 relock.

Depending on the particular embodiment of the invention, a stored state may indicate one or more of the following operating parameters of the FLL 220: a temperature sensitivity control value, a frequency control value, a period control value, a duty-cycle control value, and a supply voltage sensitivity control value. Moreover, the MCU 24 may store the state of the FLL 220 in one of many potential storage locations, such as a storage location 169 (see FIG. 2) in the non-volatile memory 168, for example; and transfer the state from the storage location to the FLL 220 in order to initialize the FLL 220 to achieve re-locking. In other embodiments of the invention, the FLL 220 may contain a register that stores the state. Thus, many variations are contemplated and are within the scope of the appended claims.

Figure 5:
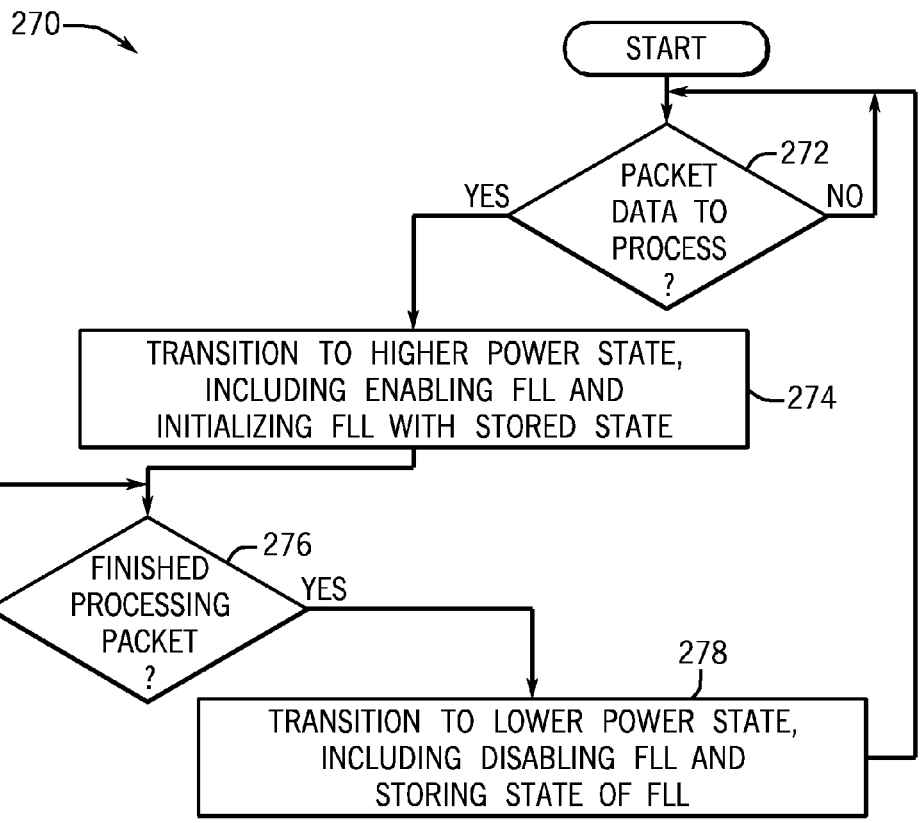
FIG. 5 is a flow diagram depicting a technique to control a frequency locked loop that generates a system clock signal for a processor that processes radio packet data according to an embodiment of the invention.

As a more specific example, FIG. 5 depicts a technique 270, which is employed by the MCU 24 to process packet data according to some embodiments of the invention. Referring to FIG. 5 in conjunction with FIGS. 2 and 3, pursuant to the technique 270, the processor core 150 determines whether there is packet data to process. If not, the processor core 150 maintains the MCU 24 in a lower power consumption state (assumed to pre-exist at the beginning of the technique 270 for this example). If, however, packet data becomes available to process, the processor core 150 transitions the MCU 24 to a higher power consumption state, which involves enabling the oscillator of the FLL 220 and initializing the FLL 220 with a previously-stored state, pursuant to block 274. Thus, the MCU 24 uses the clock signal that is furnished by the FLL 220 to clock the processor core 150 during the higher power consumption state. The MCU 24 remains in the higher power consumption state for purposes of processing the packet data. When the processor core 150 determines (diamond 276) that the packet processing is complete, the processor core 150 transitions (block 278) the MCU 24 to the lower power consumption state, which may include storing the state of the FLL 220 and disabling the oscillator before returning control to diamond 272.

In accordance with some embodiments of the invention, the stored state may be used to initialize the FLL 220 at times other than when the FLL 220 is enabled, such as, for example, when the programmable target frequency of the FLL 220 changes. In this manner, in accordance with some embodiments of the invention, the radio 28 (see FIG. 1) may employ spread spectrum encoding in its communications; and as such, the radio's oscillator may change frequencies pursuant to a frequency hopping schedule. For purposes of avoiding the introduction of interference in the signal processing path of the radio 28, the MCU 24 may, in accordance with some embodiments of the invention, change the FLL's target frequency as the radio's oscillator frequency changes. In other words, the MCU 24 may control the FLL 220 by repeatedly programming the FLL 220 with different target frequencies to implement a frequency hopping schedule for the FLL 220, which is designed to avoid interference in the radio's processing path as the radio 28 correspondingly changes frequencies. A potential challenge to changing the FLL's frequency, however, is that each time the MCU 24 programs the FLL 220 with a new target frequency, the FLL 220 undergoes a substantial time to re-lock to the new target frequency. As a non-limiting example, the processor core 150 may program and re-program the target frequency using programmable integers to establish a target frequency relative to the frequency of the reference signal, or may change the frequency of the reference signal to cause a change in the target frequency, as further described below.

To shorten the FLL's lock time, in accordance with some embodiments of the invention, FLL 220 states for one or more desired target frequencies are stored in a memory. When the FLL 220 is programmed for a new target frequency, the corresponding state is retrieved and used to initialize the FLL 220. Moreover, in accordance with some embodiments of the invention, if a stored state does not exist in memory for a particular new target frequency, an arithmetic operation of other stored states may be used to derive a new state which substantially corresponds to the new target frequency. As a non-limiting example, interpolation between two or more stored states may be performed to generate a corresponding state to use to initialize the FLL 220.

Figure 6:
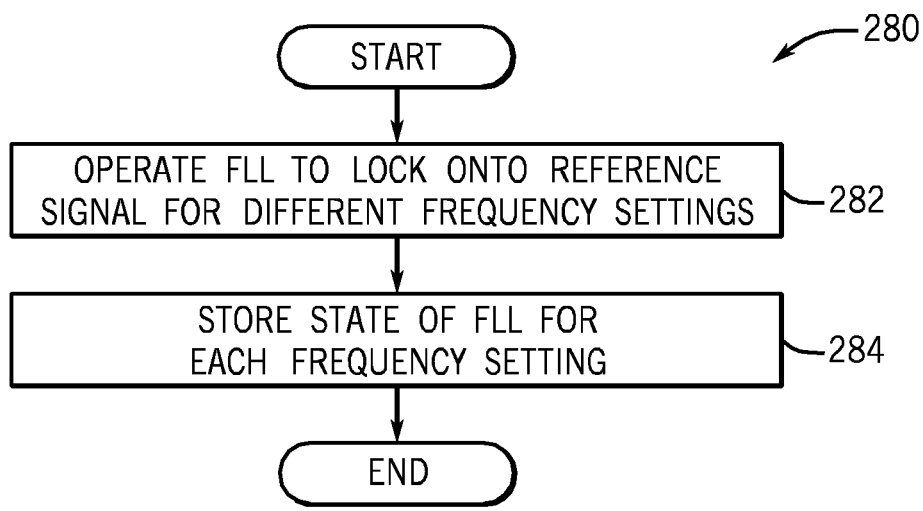
FIG. 6 is a flow diagram depicting a technique to generate calibration values to initialize a frequency locked loop for different frequencies according to an embodiment of the invention.

More specifically, referring to FIG. 6 in conjunction with FIGS. 2 and 3, in accordance with some embodiments of the invention, a technique 280 includes operating the FLL 220 to lock to the reference signal for different frequency settings, pursuant to block 282. For each of these frequency settings, the state of the FLL 220 is stored, pursuant to block 284. As a non-limiting example, the states may be stored in and retrieved from the non-volatile memory 168 by the processor core 150.

Figure 7:
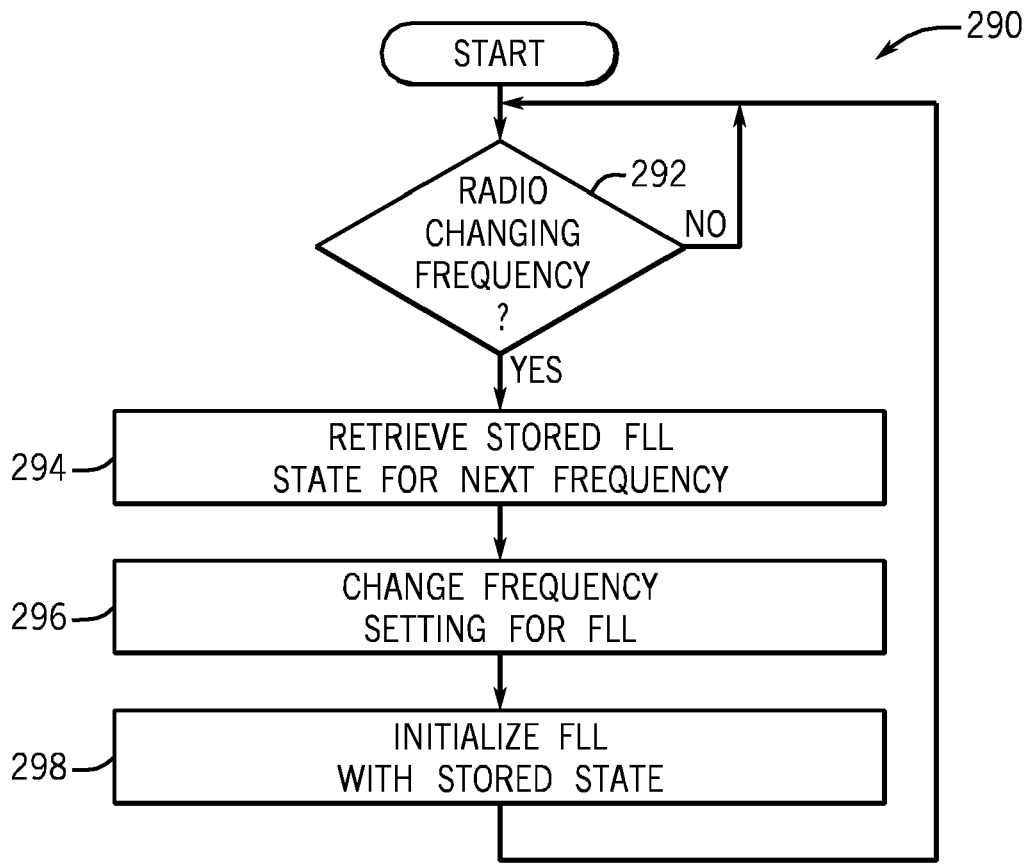
FIG. 7 is a flow diagram depicting a technique to control a frequency locked loop for frequency hopping according to an embodiment of the invention.

After the states have been stored, a technique 290, which is depicted in FIG. 7, may be used to implement frequency hopping for the FLL 220 in accordance with some embodiments of the invention. Referring to FIG. 7 in conjunction with FIGS. 2 and 3, after a determination has been made (diamond 292) that the radio 28 is changing frequency, the corresponding stored state for the FLL 220 for the next frequency is retrieved, pursuant to block 294. The frequency setting for the FLL 220 is then changed, pursuant to block 296; and the FLL 220 is initialized with the retrieved, stored state, pursuant to block 298.

Figure 8:
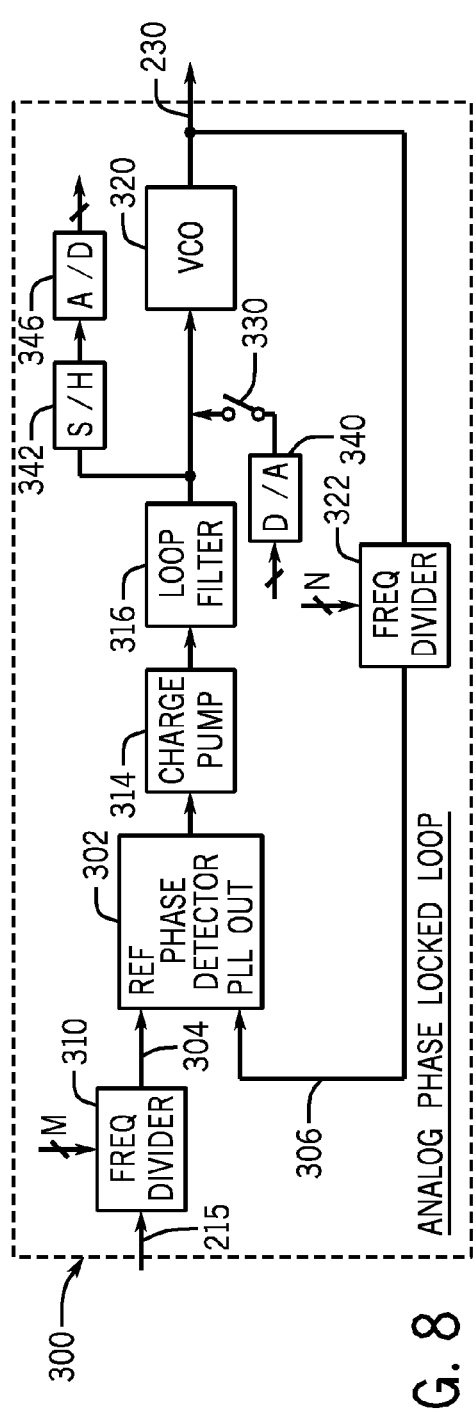
FIG. 8 is a schematic diagram of an analog phase locked loop according to an embodiment of the invention.

Referring to FIG. 8, in accordance with some embodiments of the invention, the FLL 220 may be an analog phase locked loop (PLL) 300 that includes a voltage-controlled oscillator 320 that generates a signal, called an "output clock signal" herein. The VCO's frequency is regulated to achieve locking through the use of a feedback loop, which controls the VCO based a comparison of the output clock signal with the reference clock signal that is received at the reference input terminal 215. More specifically, the PLL 300 includes a phase detector 302 that compares the phase of the output clock signal with the reference signal and controls a charge pump 314 accordingly. The signal that is produced by the charge pump 314 is filtered through a loop filter 316 to produce a control signal that regulates the frequency of the VCO 320.

For the example that is depicted in FIG. 8, the phase detector 302 compares a frequency-divided version of the reference clock signal (provided by a 1/M frequency divider 310) to a frequency-divided version of the output clock signal (provided by a 1/N frequency divider 322), which means that the target frequency of the PLL 300 is the product of N/M ratio and the frequency of the reference clock signal that is received at the terminal 215. The N and M values are programmable by the processor core 150 to establish the corresponding target frequency for the PLL 300.

For the example that is depicted in FIG. 8, the stored state of the PLL 300 includes a state of the control signal for the VCO 320. For purposes of sampling the state of the control signal, the PLL 300 includes a sample and hold (S/H) circuit 342, which samples the analog control signal to the VCO 320. An analog-to-digital (A/D) converter 346 converts this analog signal into a digital value for subsequent storage of the value in memory. When the PLL 300 is to be initialized with the stored state, a switch 330 couples the output terminal of a digital-to-analog (D/A) converter 340 (which receives the previously-stored digitized control signal value) to the output terminal of the loop filter 316.

Figure 9:
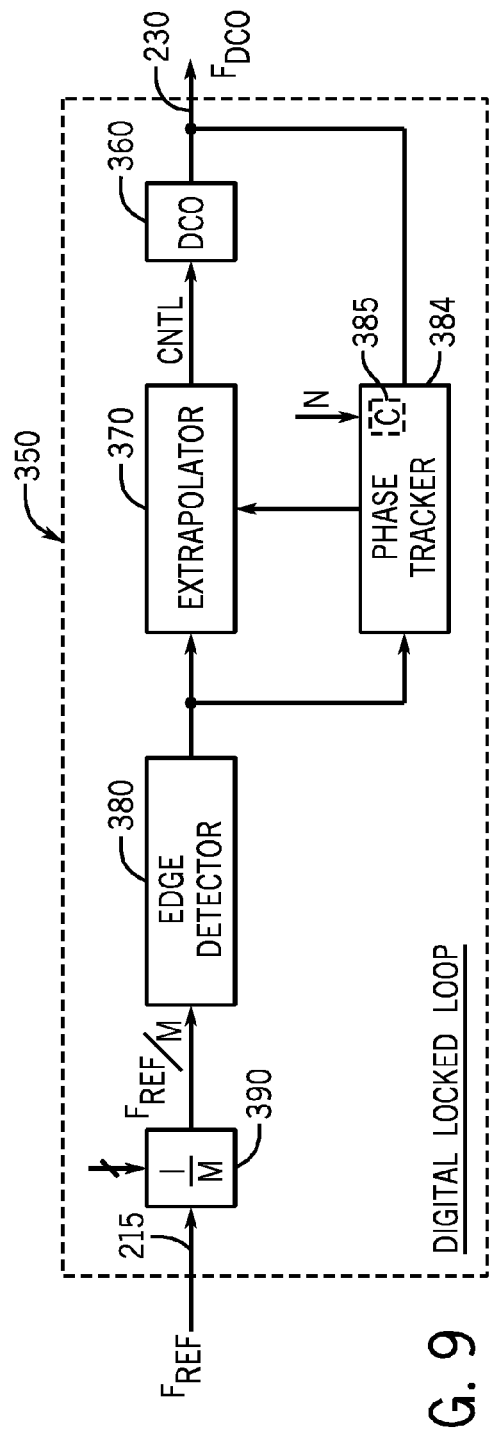
FIGS. 9, 18 and 21 are schematic diagrams of digital locked loops according to embodiments of the invention.

Referring to FIG. 9, in accordance with some embodiments of the invention, the FLL 220 may be a digital locked loop (DLL) 350 that has a digitally-controlled oscillator (DCO) 360. The output terminal of the DCO 360 furnishes a signal that is called "the output clock signal" herein and has a frequency called "$F_{DCO}$" as depicted in FIG. 9. The $F_{DCO}$ frequency is a function of and thus, is adjusted by, a control value (called "CNTL" herein) that the DLL 350 provides to the DCO 360, in accordance with some embodiments of the invention. In accordance with some embodiments of the invention, the MCU 24 stores the CNTL control value when the DLL 350 is locked and uses the stored value to initialize the DLL 350 to re-lock, as described above.

When the DLL 350 is first enabled (and thus, when the DCO 360 transitions from being disabled to being enabled), the DLL 350 is generally not frequency locked to the frequency (called "$F_{REF}$" in FIG. 9) of the reference clock signal. As further described below, after being enabled, the DLL 350 adjusts the CNTL control value to frequency lock the DLL 350 onto the reference clock signal.

For purposes of achieving this frequency lock, the DLL 350 includes an extrapolator 370, which generates the CNTL control value based on, among other factors, the transfer function of the DCO 360. In this manner, the "transfer function" of the DCO 360 is the relationship between the oscillation frequency or period of the DCO 360 and the CNTL control value. More specifically, referring to FIG. 5 in conjunction with FIG. 4, in accordance with some embodiments of the invention, the transfer function of the DCO 360 is modeled as being linear. As a non-limiting example, as shown in FIG. 5, the oscillation period of the DCO 360 versus the CNTRL control value may be modeled as a linear relationship that is represented by a line 404. It is noted that FIG. 5 depicts multiple lines 404, with the specific line 404 being selected based on the particular operating frequency range that is selected for the DCO 360.

Although the linear model is specifically discussed herein in a non-limiting example, the transfer function of the DCO 360 may be modeled as being non-linear (exponential, logarithmic, etc.), in accordance with other embodiments of the invention. Thus, many variations are contemplated and are within the scope of the appended claims.

As a more specific example, assuming that the frequency range that is selected for the DCO 360 corresponds to transfer function 404a, the DCO 360 may be at a current operating state that is illustrated at point 405 on the transfer function 404a. The extrapolator 370 may determine, as further described below, that the operating point of the DCO 360 should be moved to a new operating point 407 on the transfer function 404a for frequency locking to occur. To achieve this change, the extrapolator 370 takes into consideration the linear nature of the specific transfer function 404a to extrapolate the corresponding CNTL control value. Furthermore, if the corresponding CNTL control value falls outside specific limits, the extrapolator 370 may automatically select a different frequency range and repeat the extrapolation. For example, if an extrapolated CNTL control value exceeds a specific upper limit, the extrapolator 370 may select a lower frequency range and determine a new CNTL control value given this new frequency range. Similarly, if an extrapolated CNTL control value falls below a specific lower limit, the extrapolator 370 may select a higher frequency range and determine a new CNTL control value given this new frequency range.

For the following example of a control scheme employed by the extrapolator 370, it is assumed that the DLL 350 simultaneously performs frequency and phase locking. Another control scheme in which a DLL first performs frequency locking and optionally subsequently performs phase locking in a two stage control scheme is discussed further below in connection with FIG. 13.

As depicted in FIG. 9, in accordance with some embodiments of the invention, the actual reference clock signal that is tracked by the DLL 350 is a frequency-divided version of the reference clock signal that is received at the reference terminal 215 of the DLL 350. In this manner, in accordance with some embodiments of the invention, the DLL 350 includes a frequency divider 390, which divides the reference clock signal that appears on the reference terminal 215 by the programmable integer M to produce a signal called the "frequency-divided reference clock signal" herein. As depicted in FIG. 9, the frequency-divided reference clock signal has a frequency of $F_{REF}/M$. In accordance with other embodiments of the invention, the frequency divider 390 is not restricted to integer values of M. Thus, other dividers, such as dividers that support fractional divide values, may be used and are within the scope of the appended claims.

The DLL 350 also includes an edge detector 380 and a phase tracker 384. The edge detector 380 detects the rising, or positive, edges of the frequency-divided reference clock signal and provides a signal indicating detection of these edges to the extrapolator 370 and phase tracker 384. In other embodiments of the invention, the edge detector 380 may be replaced with an edge detector that detects the falling, or negative, edges of the frequency-divided reference clock, or both edges of the frequency-divided reference clock. The phase tracker 384 measures how many periods of the output clock signal elapse during a given period of the frequency-divided reference clock signal. More specifically, the phase tracker 384 includes an incrementing counter 385 that is clocked by the output clock signal and thus, increments its stored value in response to each cycle of the output clock signal. As a non-limiting example, the counter 385 many increment its stored count in response to each rising, or positive, edge of the output clock signal. In other embodiments of the invention, the counter 385 may be replaced with a counter that decrements the stored count in response to detected edges of the output clock signals or increases or decreases the stored count in steps other than one.

The counter 385 cycles through "N" counts when the DLL 350 is frequency locked, where "N" is a programmable integer (via the processor core 150, for example) and represents how many periods of the output clock signal occur during one frequency-divided reference clock period when the DCO 350 is frequency locked. Therefore, when the DLL 350 is frequency locked, the $F_{DCO}$ frequency is equal to $F_{REF} \cdot N/M$. In accordance with other embodiments of the invention, the counter 385 may be replaced with a counter that is not restricted to integer values of N. Thus, other counters, including counters that support fractional count values, may be alternatively used and are within the scope of the appended claims.

In a control scheme according to some embodiments of the invention, when the DLL 350 is frequency and phase locked, the value of the counter 385 is initialized to −N at one positive edge of the frequency-divided reference clock signal; and the counter 385 increments to a value of zero right before the next positive edge of the frequency-divided reference clock signal. The extrapolator 370 regulates the CNTL control value based on the transfer function of the DCO 360 and the count values provided by the counter 385 to control the DCO 360 to achieve and maintain frequency and phase locking, as further described below.

Figure 11:
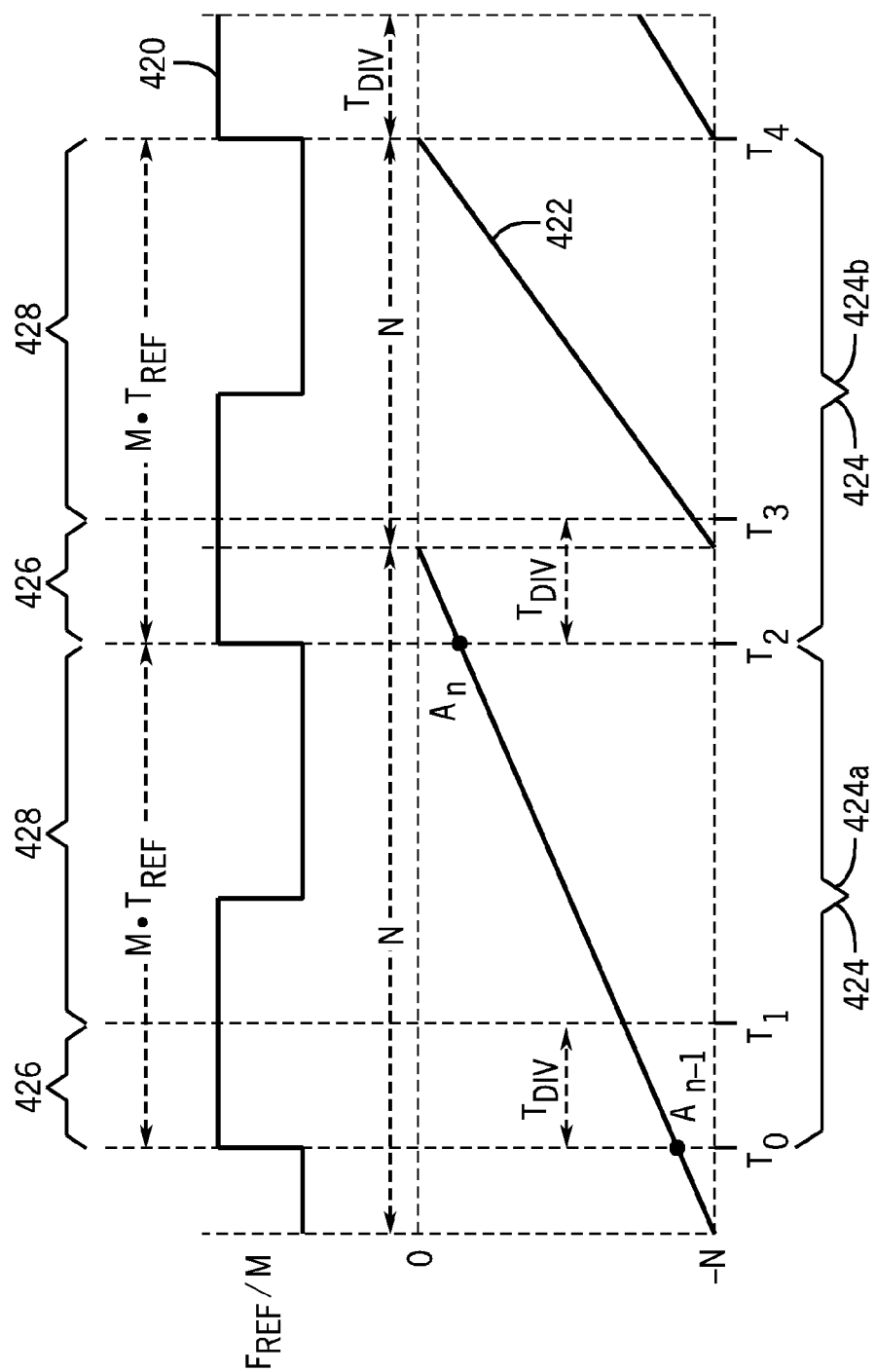
FIGS. 11-13 are waveforms illustrating extrapolation of a calibration value for the digitally-controlled oscillator according to embodiments of the invention.

To illustrate one type of control scheme that may be employed by the DLL 350, FIG. 11 depicts an exemplary waveform 420 of the frequency-divided reference clock signal and an exemplary waveform 422 of the count value provided by the counter 385 for two successive cycles 424 of the waveform 420: an initial cycle 424a during which the DLL 350 is unlocked and an immediately successive cycle 424b in which the DLL 350 achieves frequency and phase locking.

Referring to FIG. 11 in conjunction with FIG. 9, in response to the signaling from the edge detector 380, the extrapolator 370 samples the count value of the counter 385 on each positive edge of the waveform 420. Thus, for the example depicted in FIG. 11, at time $T_o$ at the beginning of the cycle 424a, the counter value is $A_{n-1}$; and at time $T_2$ at the end of the cycle 424a, the counter value is $A_n$. When the DLL 350 is locked, the number of counts over the duration of the cycle 424a (i.e., $A_n$ less $A_{n-1}$) is N. However, as depicted in FIG. 11, during the initial cycle 424a, the counter 385 is clocked less than N times. Although not illustrated, it is noted that in the unlocked state of the DLL 350, the counter 385 may alternatively be clocked by more than N cycles.

During each cycle 424, the extrapolator 370 generally takes the same finite time (called "$T_{DIV}$" in FIG. 6) to calculate a new CNTL control value. More specifically, the extrapolator 370, whose operations may be clocked by the DCO's output clock signal, takes the same number of DCO cycles to determine the next CNTL control value. Therefore, each cycle 424 includes time 426 in which the DCO 360 is operating under the old CNTL control value (i.e., the $T_{DIV}$ time in which the extrapolator 370 is calculating the new CNTL control value) and an immediately successive time 428 that is controlled according to the new CNTL control value. Specifically, for the cycle 424a, the DCO 360 is controlled by the previously-determined CNTL control value, and the extrapolator 370 is calculating the new CNTL control value during the time 426 from time $T_0$ to time $T_1$; and the DCO 360 is controlled by the new CNTL control value during the remainder 428 of the cycle 424a from time $T_1$ to time $T_2$.

In accordance with some embodiments of the invention, the new CNTL control value is derived based on the following. The periods of two cycles of the frequency-divided reference clock signal, such as cycles 424a and 424b, may be equated, because the period of this signal may be assumed to be constant. Equating the two periods produces the following relationship:

$$T_{n-1} \cdot Q_{DIV} + (A_n - A_{n-1} - Q_{DIV}) \cdot T_n = T_n \cdot Q_{DIV} + (N - A_n - Q_{DIV}) \cdot T_{n+1}, \quad \text{Eq. 1}$$

where "$Q_{DIV}$" represents the number of cycles of the output clock signal in the time $T_{DIV}$ time, i.e., the number of DCO cycles it takes to calculate the CNTL control value; "$T_{n-1}$" represents the period of the DCO 360 prior to time $T_1$; and "$T_n$" represents the period of the DCO 360 from $T_1$ to time $T_3$. In general, the $T_n$ period is a function of the transfer function of the DCO 360, in accordance with some embodiments of the invention, as described below:

$$T_n = J_R \cdot (CNTL_n - K_0), \quad \text{Eq. 2}$$

where "$J_R$" represents a constant that describes the slope of the transfer function for a selected frequency range for the DCO 360, as illustrated by the different transfer functions 404 in FIG. 5. The $J_R$ constant cancels out of the equations used in the derivation of the CNTL control value.

In the following discussion, the following substitution is applied to clarify the equations:

$$C_n = (CNTL_n - K_0), \quad \text{Eq. 3}$$

where "$C_n$" represents a normalized control value. Given the relationships that are set forth in Eqs. 2 and 3, Eq. 1 may be rewritten as follows:

$$C_{n-1} \cdot Q_{DIV} + (A_n - A_{n-1} - Q_{DIV}) \cdot C_n = C_n \cdot Q_{DIV} + (N - A_n - Q_{DIV}) \cdot C_{n+1}, \quad \text{Eq. 4}$$

where "$C_{n-1}$" represents the prior normalized control value (prior to time $T_1$), "$C_n$" represents the normalized control value between times $T_1$ and $T_2$, and $C_{n+1}$ represents the new normalized control value to be applied at time $T_3$. Based on Eq. 4, the $C_{n+1}$ new normalized control value, which is calculated by the extrapolator 370 is the following:

$$C_{n+1} = \frac{C_{n-1} \cdot Q_{DIV} + C_n \cdot (A_n - A_{n-1} - Q_{DIV}) - C_n \cdot Q_{DIV}}{N - A_n - Q_{DIV}}. \quad \text{Eq. 5}$$

In Eq. 5, the expression "$C_{n-1} \cdot Q_{DIV} + C_n \cdot (A_n - A_{n-1} - Q_{DIV})$" represents the active normalized control value accumulated between the positive edges of the frequency-divided clock signal, and $C_n \cdot Q_{DIV}$ represents a correction for the CNTL control value processing time.

Figure 12:
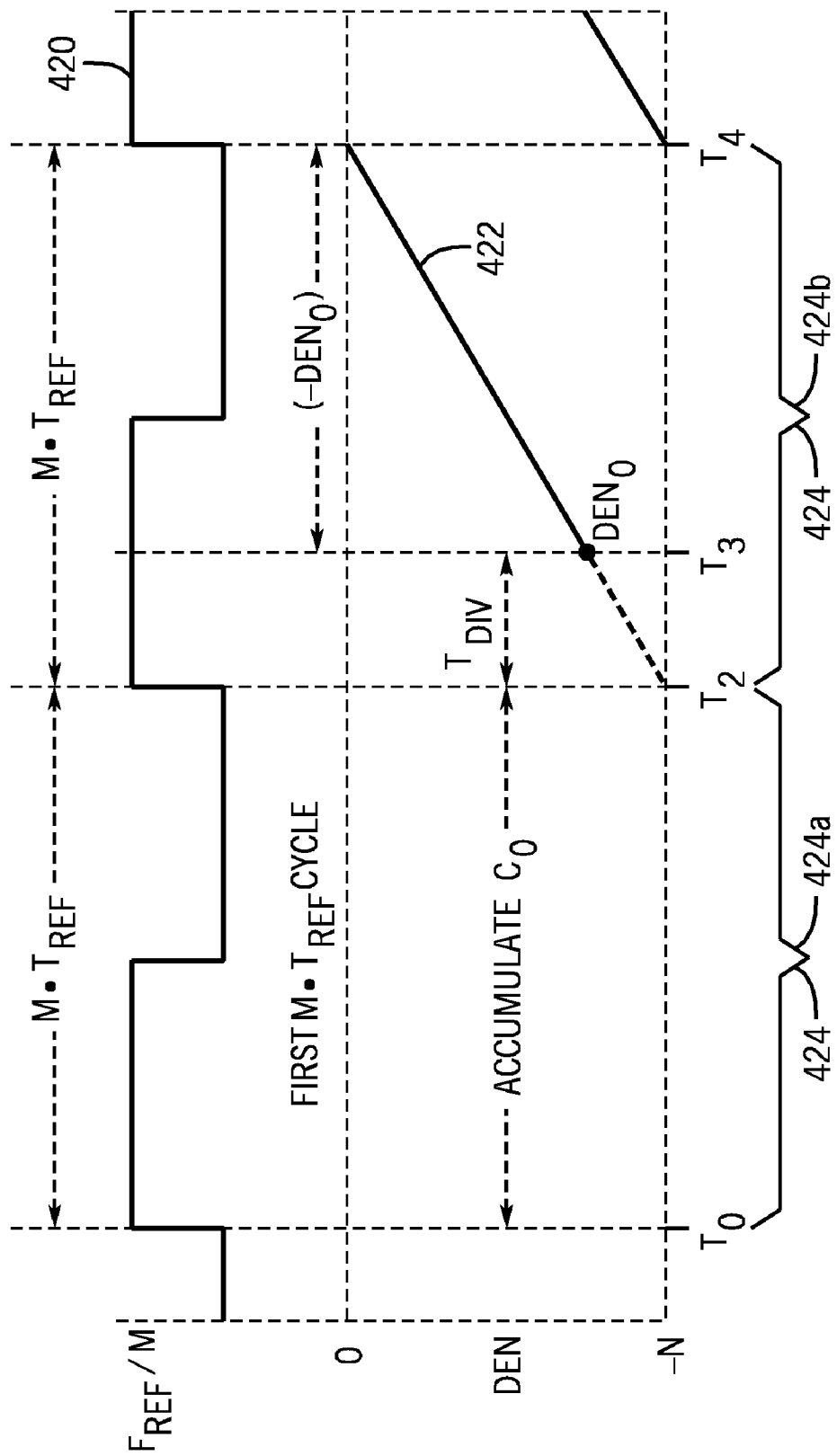

FIG. 12 illustrates a scenario in which cycle 424a is the first cycle of the frequency-divided reference clock signal in which the DLL 350 transitions from being disabled to being enabled. During the cycle 424a, an initial normalized control value (called "$C_0$") is accumulated. The next normalized control value for the DCO 360, called "$C_1$," is the following:

$$C_1 = \frac{\sum_{FirstCycle} C_0}{N} \quad \text{Eq. 6}$$

Referring to FIG. 12 in conjunction with FIG. 9, for the next cycle 424b, the counter 385 is initialized to a value called "$DEN_0$" and begins counting at time $T_3$ (after the $T_{DIV}$ time), such that the count value of counter 385 is zero at time $T_4$, which is at the next rising, or positive, edge of the frequency-divided reference clock signal. If the $T_{DIV}$ time is hypothetically equal to zero (i.e., time $T_3$ is shifted to time $T_2$), then the $DEN_0$ value is equal to $-N$. However, for the actual case in which the $T_{DIV}$ time is finite, the $DEN_0$ value is given by the intercept of this same line with the $T_{DIV}$ period. Equating the slopes produces the following relationship:

$$\frac{(DEN_0 + N)}{T_{DIV}} = \frac{N}{T_{DIV} - DEN_0 \cdot T_1} \quad \text{Eq. 7}$$

Solving for the $DEN_0$ value produces the following:

$$DEN_0 = -N + \frac{Q_{DIV} \cdot C_0}{C_1} \quad \text{Eq. 8}$$

If $C_0$ and $C_1$ are approximately the same, which is a reasonable approximation, then the $DEN_0$ value may be estimated to be "$-N + Q_{DIV}$."

Figure 13:
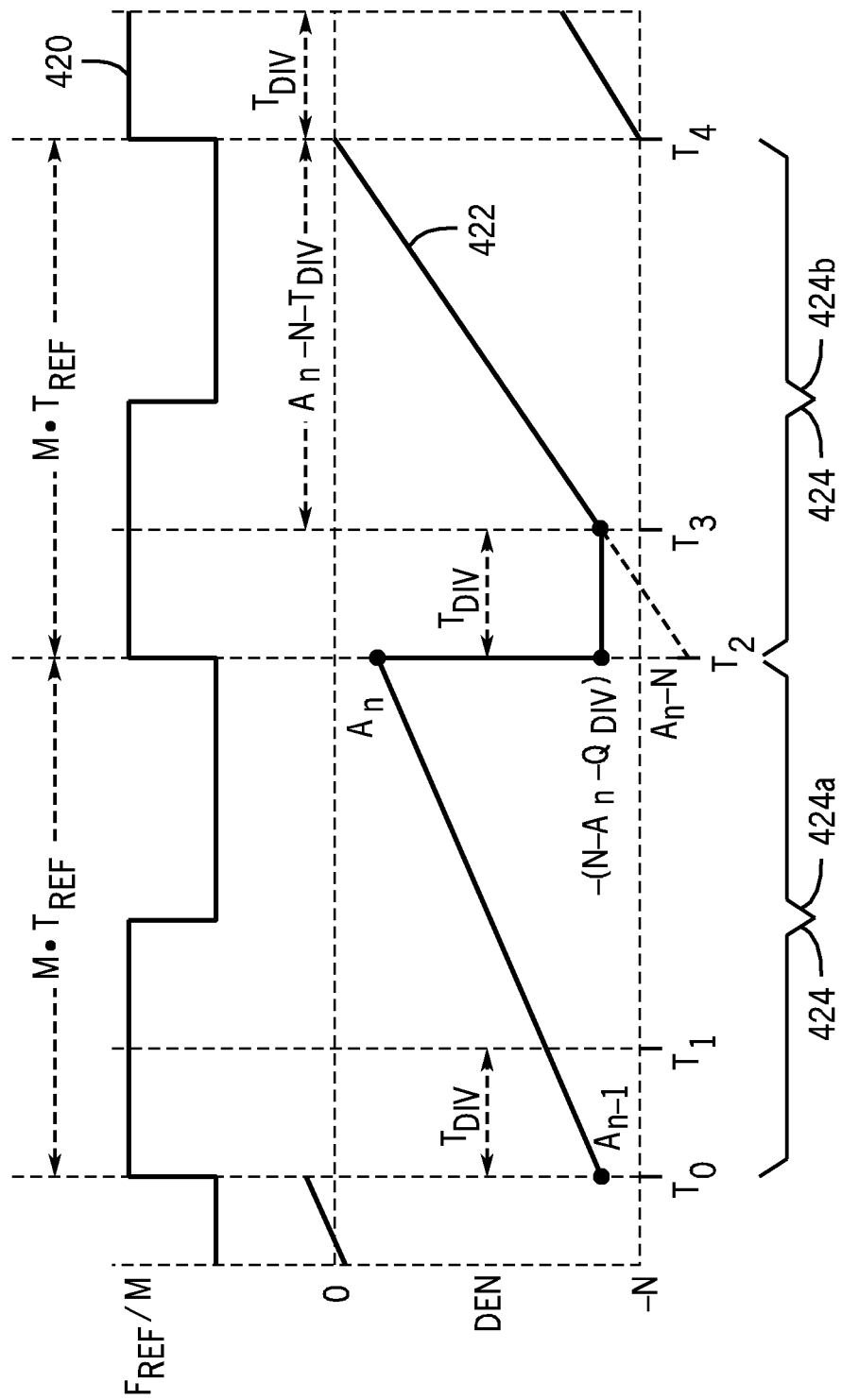

Referring to FIG. 13, in accordance with some embodiments of the invention, the phase tracker 384 adjusts the count value of the counter 385 in response to each positive edge of the frequency-divided reference clock signal, rather than when the count value reaches zero. Moreover, the phase tracker 384 reduces the count value by "$N - Q_{DIV}$" on each positive edge of the frequency-divided reference clock signal such that the count value is adjusted according to the denominator of Eq. 5, thereby creating an initial count for the register 385 of "$-(N - A_n - Q_{DIV})$" at the beginning of each cycle of the frequency-divided reference clock signal. Because this initial count is equal to the denominator of Eq. 5, this value is referred to as the "DEN denominator value" herein. As depicted in FIG. 13, the phase tracker 384, in accordance with some embodiments of the invention, inhibits the counter 385 from incrementing after the positive edge of the frequency-divided reference clock signal until after the $Q_{DIV}$ period elapses with no loss in phase information.

Figure 14:
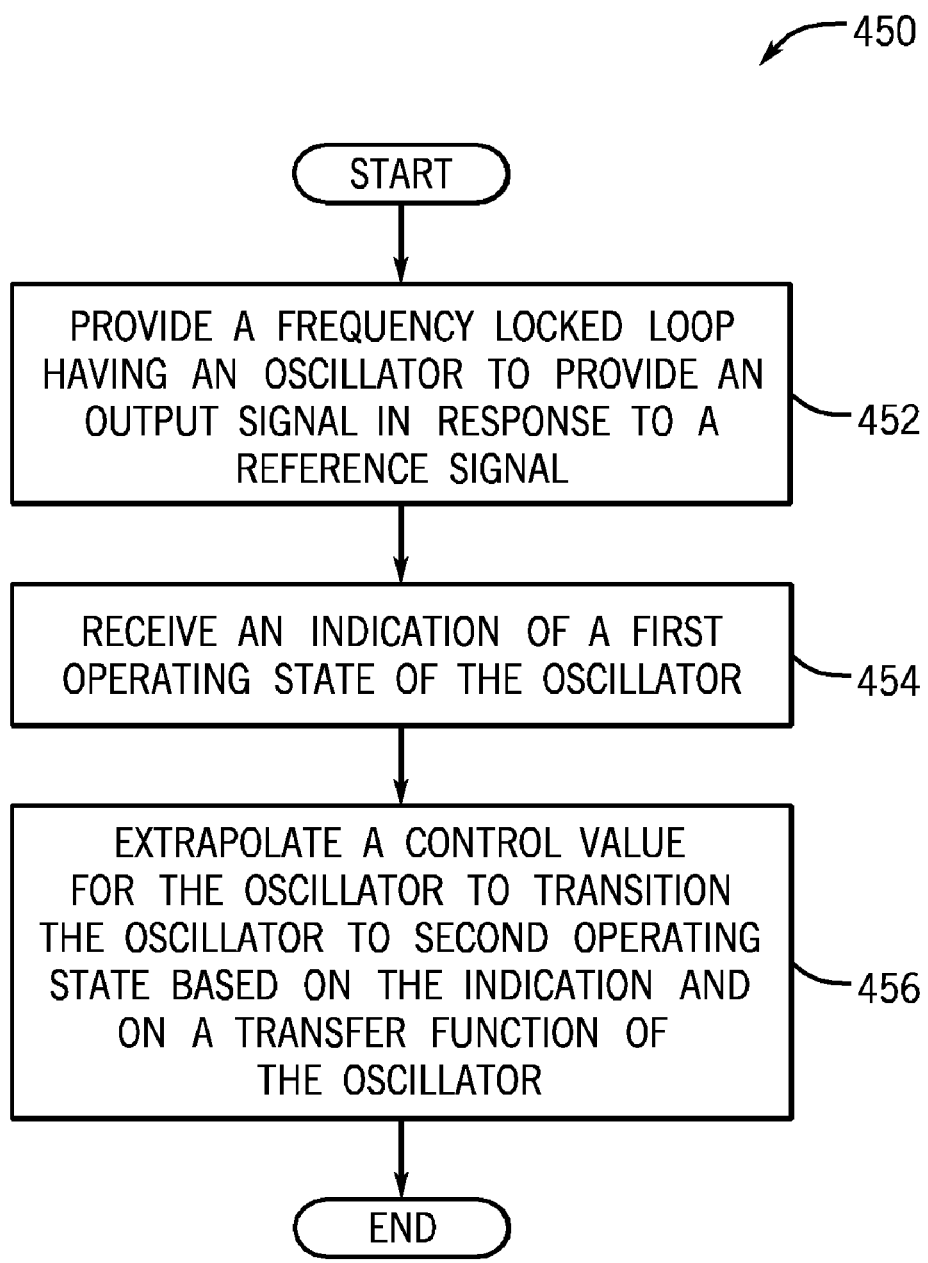
FIG. 14 is a flow diagram depicting a technique to control the digitally-controlled oscillator according to an embodiment of the invention.

Thus, referring to FIG. 14, in accordance with some embodiments of the invention, a technique 450 includes providing (block 452) a frequency locked loop that has an oscillator to provide an output signal in response to a reference signal. An indication of a first operating state of the oscillator (a current or previous operating state of the oscillator, as examples) is received (block 454) and a control value for the oscillator to transition the oscillator to a second operating state is extrapolated (block 456) based at least in part on the indication and on the transfer function of the oscillator. As a non-limiting example, the control value may be determined using a linear approximation to the oscillator's actual transfer function, in accordance with embodiments of the invention. The technique 450 may be repeated a number of times depending on the embodiment of the invention. For example, in accordance with some embodiments of the invention, the DLL 350 may repeat the technique 450 a specific number of times and then inhibit further changes to the control value. In other embodiments of the invention, the DLL 350 may implement the technique 450 repeatedly as long as the DLL 350 is enabled.

Figure 15:
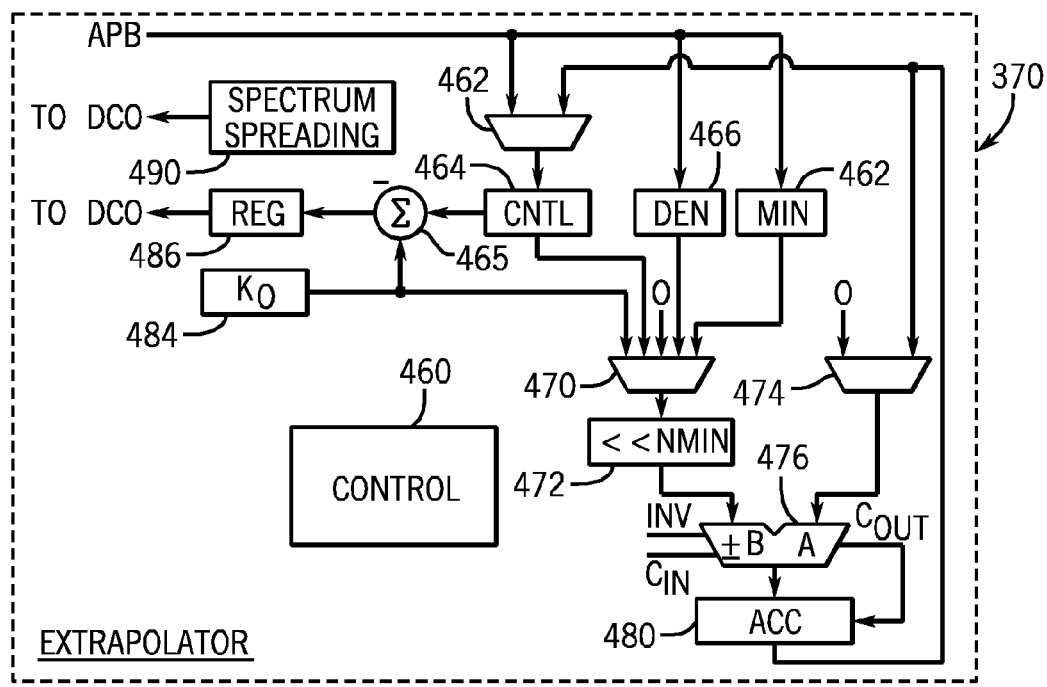
FIG. 15 is a schematic diagram of an extrapolator of the digital locked loop of FIG. 9 according to an embodiment of the invention.

In accordance with some embodiments of the invention, the extrapolator 370 has an architecture similar to the one depicted in FIG. 15, although the extrapolator may have other architectures, in accordance with the many possible embodiments of the invention. As non-limiting examples, other possible architectures may incorporate programmable elements, such as processors, microcontrollers, and programmable logic devices. Referring to FIG. 15, in general, the extrapolator 370 includes an arithmetic logic unit (ALU), which includes multiplexers 470 and 474, a left shifter 472 and an adder 476. The ALU in combination with a register 480 permits accumulation, division, delay correction and limit checks for the extrapolator 370 to calculate each new CNTL control value as described herein. The extrapolator 370 further includes a NORM register 464 that stores the current normalized control value (i.e., CNTL-$K_0$), a register 468 that stores a minimum allowed value (MIN) for the normalized control value, and a register 484 that stores a value for the $K_0$ constant value. The extrapolator 370 further includes a DEN denominator value calculator 466.

As depicted in FIG. 15, the multiplexer 470, depending on the particular operation being performed, selects either the $K_0$ value, the normalized control value, the DEN denominator value, the MIN value, or zero. Moreover, the multiplexer 474 either selects the content of the register 480 or zero, depending on the particular value being calculated.

Figure 10:
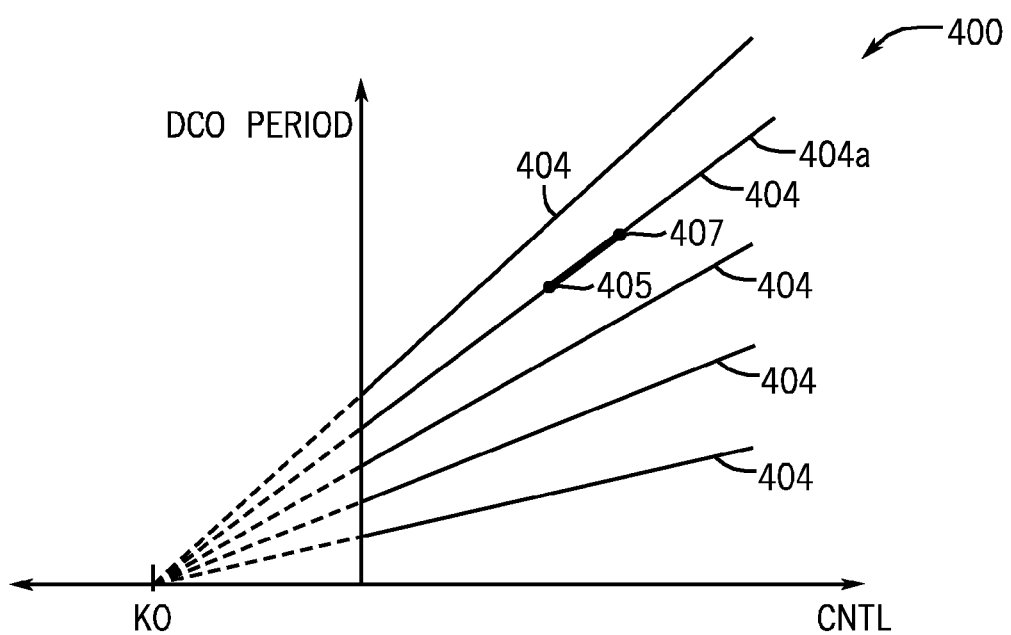
FIG. 10 is an illustration of transfer characteristics of the digitally-controlled oscillator of the digital locked loop for different frequency ranges of operation according to an embodiment of the invention.

As also depicted in FIG. 10, the extrapolator 370 includes a multiplexer 462, which receives either a value from the processor bus or the content that is stored in the register 480. The multiplexer 462 has its output terminals coupled to the control register 464. This arrangement permits the updating of the normalized control value to the new extrapolated value, as described above.

Among the other features of the extrapolator 370, the extrapolator 370 also includes an adder 465 that adds the $K_0$ value to the normalized control value stored in the NORM register 464 (in accordance with some embodiments of the invention) to produce the CNTL control value for the DCO 360, which is stored in a register 486. Additionally, the extrapolator 370 includes a spectrum spreading modulator 490 that furnishes a signal to the DCO 360 for purposes of implementing frequency hopping associated with the spectrum spreading, in accordance with some embodiments of the invention. In this manner, the modulator 490 may, for example, change the N value, the M value or both of the M and N values for purposes of changing the frequency of the DLL's output clock signal according to a frequency hopping schedule. The modulator 490 may also implement frequency hopping by directly altering the CNTL control value, for example by adding a sequence of random or pseudo-random values to the control value at regular (or irregular) intervals. This addition may be implemented in a number of ways, for example (but not limited to) using digital addition logic or performing analog addition in the DCO. As also shown in FIG. 15, the extrapolator 370 includes a control unit 460 for purposes of controlling the above-described operations of the extrapolator 370.

Figure 16:
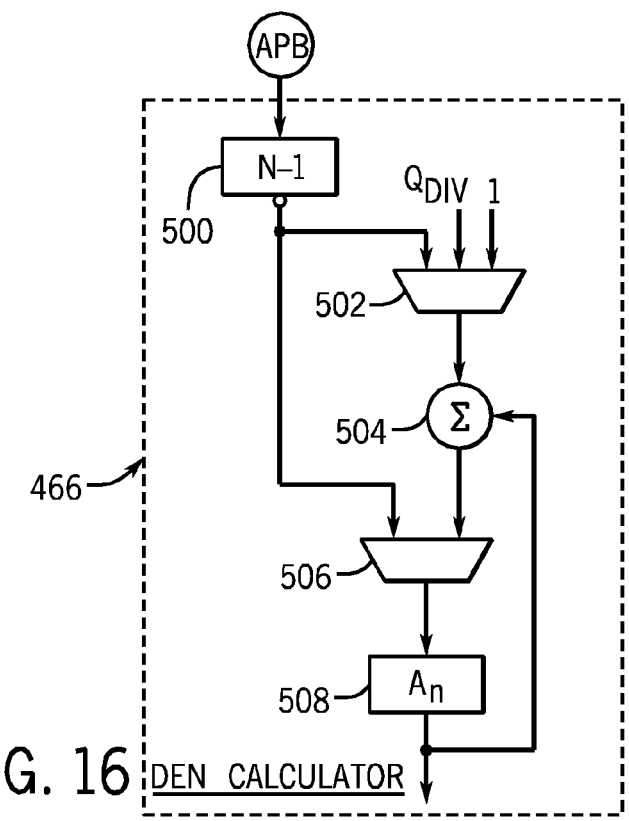
FIG. 16 is a schematic diagram of a circuit to determine a counter initialization value and updated values for the phase tracker of FIG. 9 according to an embodiment of the invention.

Referring to FIG. 16, in accordance with some embodiments of the invention, the DEN denominator value calculator 466 (see FIG. 15) has an architecture which uses a dedicated accumulator in addition to a register 508 for purposes of tracking the phase error. The accumulator includes a register 500 that stores a value equal to N−1; and a multiplexer 502 that selects the ones-complement of the N−1 value, the $Q_{DIV}$ value or one for purposes of providing the selected value to an adder 504. The adder 504 adds the value provided by the multiplexer 502 to the content of the register 508 and provides this value to an input terminal of a multiplexer 506. Another input of the multiplexer 506, in turn, receives the ones-complement of the N−1 value, and the output terminal of the multiplexer 506 furnishes the value that is stored in the register 508. Due to this arrangement, when the calculator 466 determines the DEN denominator value, the register 508 stores the $A_N$ value; and −N and $Q_{DIV}$ are added to the $A_N$ value. When not calculating the $A_N$ value, the DEN calculator 466 increments the value that is stored in the register 508 to track the phase error.

Figure 17:
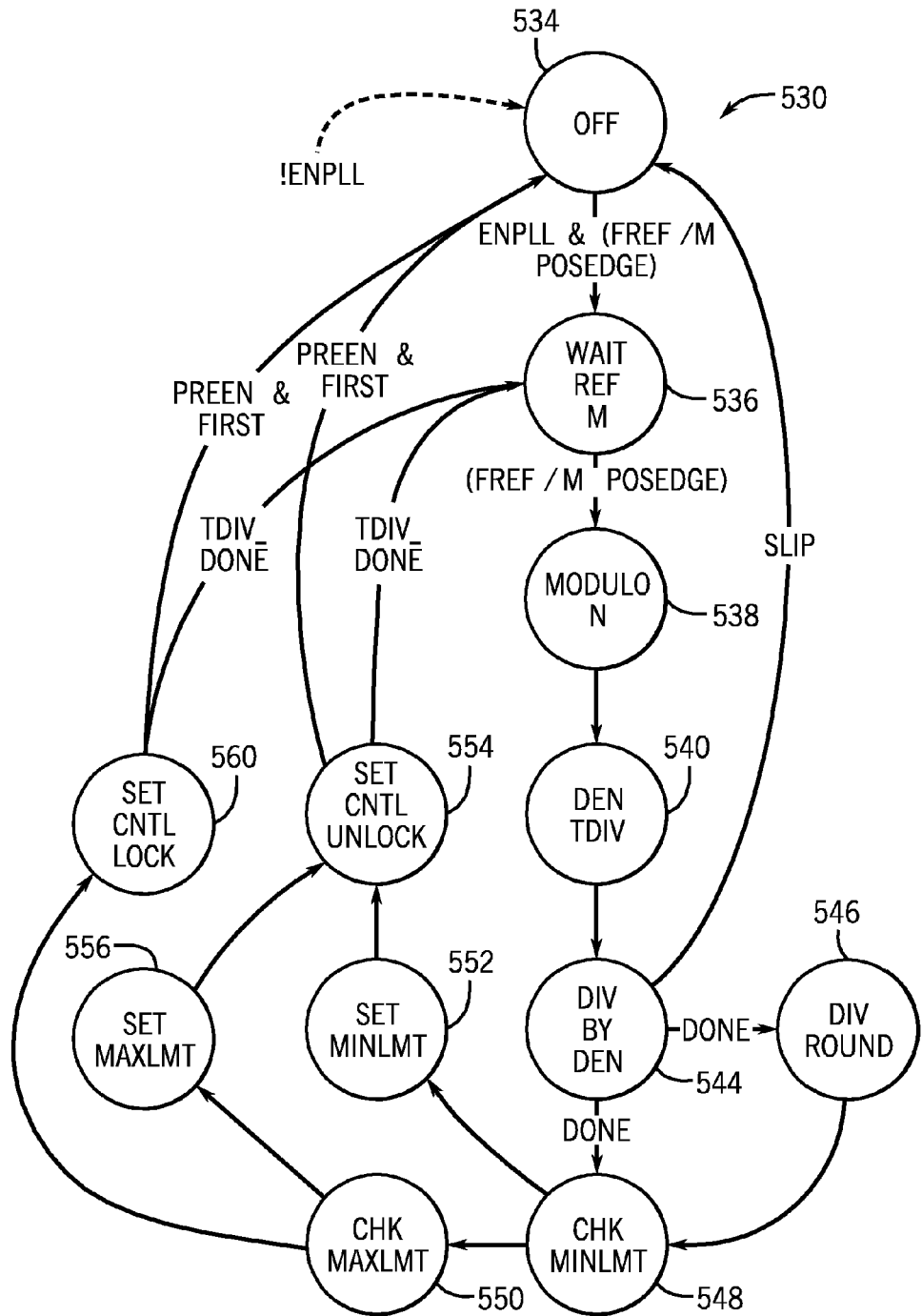
FIG. 17 is a state diagram for the extrapolator of the digital locked loop of FIG. 9 according to an embodiment of the invention.

FIG. 17 depicts a state diagram 530 for the control unit 460 (see FIG. 15) of the extrapolator 370, in accordance with some embodiments of the invention. In general, the control unit 460 manages the lock sequence and manages the control of the arithmetic processing by the extrapolator 370. The extrapolator 370 transitions to an off state 534 when the DLL 350 is disabled. In accordance with some embodiments of the invention, the disabling of the DLL 350 involves disabling the DCO 360. Upon the DLL 350 being enabled and upon the first positive edge of the frequency-divided reference clock signal, the extrapolator 370 transitions to a wait state 536 in which the extrapolator 370 accumulates the normalized control value while waiting for the next positive edge of the frequency-divided reference clock signal. Upon the next positive edge of the frequency-divided reference clock signal, the extrapolator 370 transitions to a modulo N state 538, in which the extrapolator 370 subtracts the $Q_{DIV}$·NORM product from the accumulator of the extrapolator 370 and adds −N to the DEN denominator value.

The extrapolator 370 then transitions to a state 540 in which the extrapolator 370 adds the $Q_{DIV}$ to the DEN denominator value. Control then transitions to state 544 in which the extrapolator 370 performs the shift-and-subtract division of the update equation. When the above-described arithmetic operations are performed, the extrapolator 370 transitions to a state 546 in which the extrapolator 370 rounds the division result. At this point, the extrapolator 370 has derived a candidate normalized control value.

The extrapolator 370 next transitions to states 548 and 550 for purposes of checking whether the candidate normalized control value is within an allowed range. More specifically, the extrapolator 370 transitions to state 548 for purposes of checking whether the candidate normalized control value exceeds a minimum limit and transitions to state 550 for purposes of determining whether the candidate normalized control value exceeds a maximum limit. If the candidate normalized control value is within the allowed range, then the candidate normalized control value becomes the new normalized control value, and the DLL 350 is locked both in frequency and phase, in accordance with some embodiments of the invention. Therefore, if locking has occurred (as indicated by the new normalized control value being within the allowed range), the extrapolator 370 transitions to a state 560 in which a flag is set indicating the locked state of the DLL 350, and control transitions back to either state 534 or 536, as described below.

If the candidate normalized control value is outside of the allowed range, then locking has not yet occurred. More specifically, if the candidate normalized control value is less than the minimum limit, then control transitions from state 548 to state 552, in which the extrapolator 370 sets the normalized control value stored in the NORM register 464 to the minimum limit. If the normalized control value is greater than the maximum limit, then control transitions from state 550 to state 556 in which the extrapolator 370 sets the normalized control value stored in the NORM register 464 to the maximum limit. Both states 552 and 556 transition to state 554, in which the extrapolator 370 sets a flag indicating that the DLL 350 is unlocked.

Control transitions from either state 554 (when the DLL 350 is unlocked) or 560 (when the DLL 350 is locked) to either state 534 or state 536, depending on whether the DLL 350, since last being enabled, is in the first cycle (state 534) of the frequency-divided reference clock signal or in a subsequent cycle (state 536) of this clock signal.

Figure 18:
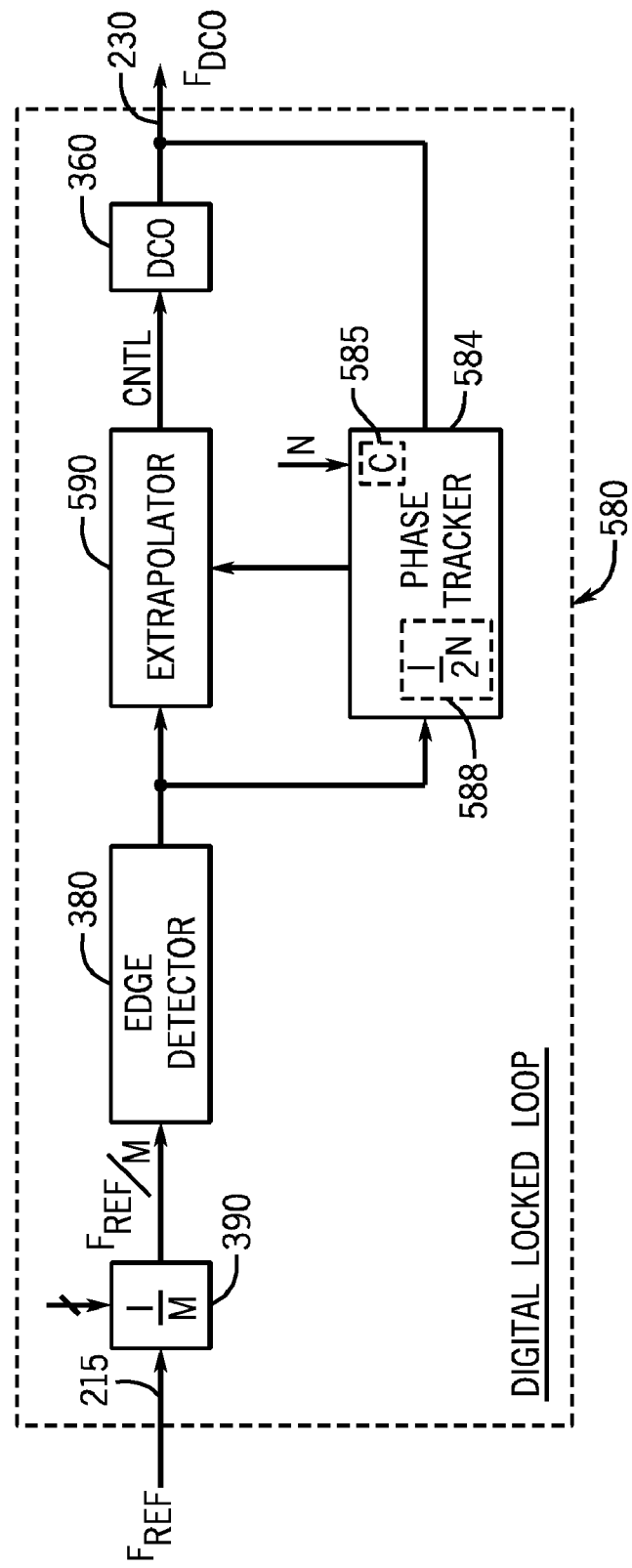

Referring to FIG. 18, in accordance with other embodiments of the invention, the DLL 350 (see FIG. 9) may be replaced with a DLL 580. The DLL 580 has features that are similar to corresponding features of the DLL 350, with the similar components being denoted by the same reference numerals. Unlike the DLL 350, the DLL 580 includes an extrapolator 590, which employs a two-stage control scheme: a first stage in which the extrapolator 590 determines a normalized control value (called "C" herein) to frequency lock the DLL 580; and a second stage in which the extrapolator 590 determines a normalized control value (called "C" herein) to phase lock the DLL 580. For these embodiments of the invention, when the DLL 580 is frequency locked, there are $2^N$ periods of the output clock signal (instead of N) in one period of the frequency-locked reference signal. Therefore, a phase tracker 584 (replacing the phase tracker 384) includes an incrementing counter 585 that counts through a count value of $2^N$ when the DLL 580 is frequency locked.

More specifically, in these embodiments of the invention, the extrapolator 590 corrects for the frequency error on the rising edge of the frequency-divided reference clock signal and corrects for the phase error on the falling, or negative, edge of a clock signal that is a frequency-divided version of the output signal for the DLL 580. More specifically, in accordance with some embodiments of the invention, this frequency-divided version of the output clock signal has a frequency of $F_{DCO}/2^N$, which is provided by a frequency divider 588 of the phase tracker 584.

Figure 19:
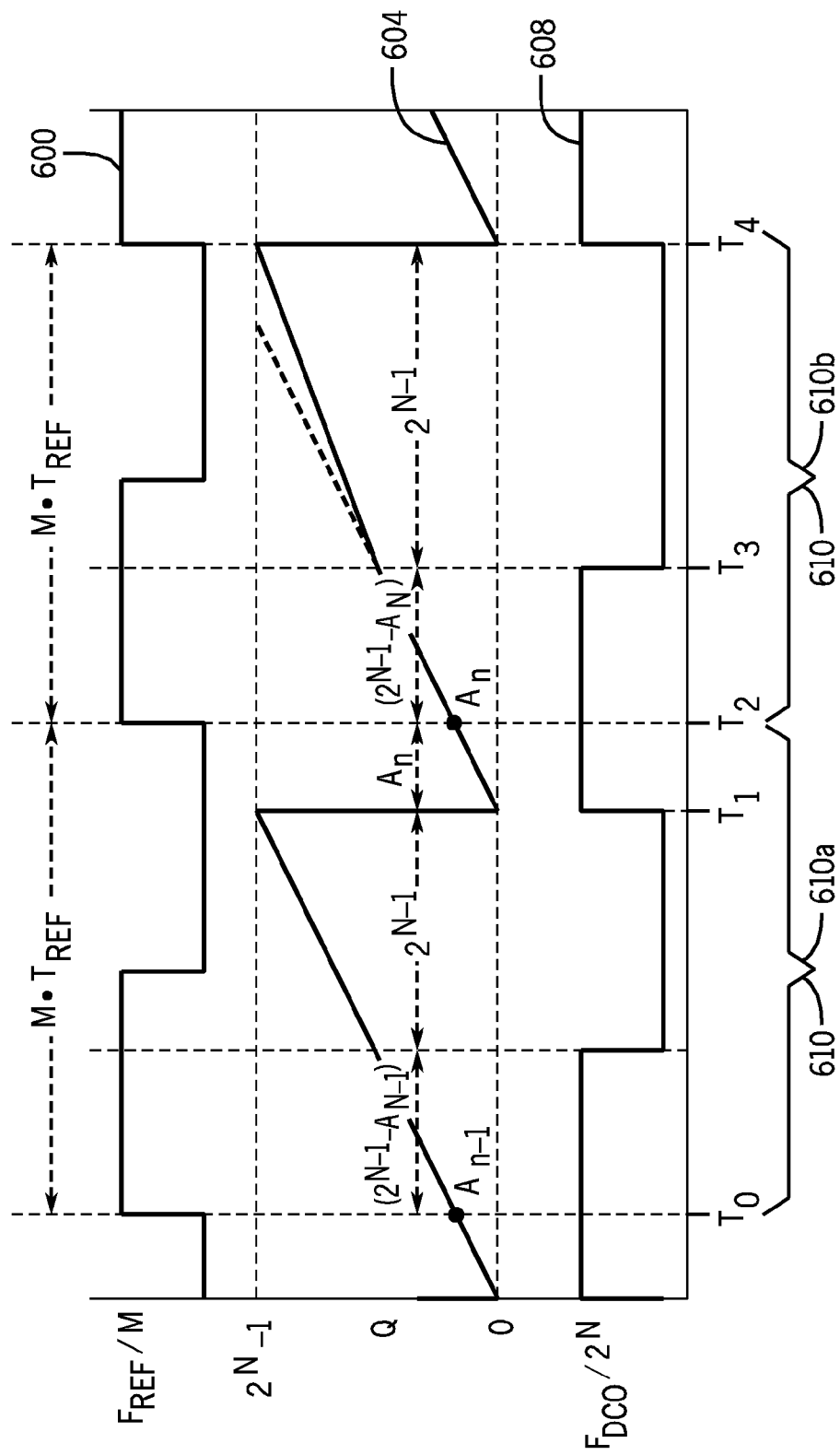
FIG. 19 illustrates waveforms associated with a two stage control scheme for locking the digital locked loop according to an embodiment of the invention.

To illustrate the two stage control, FIG. 19 depicts a waveform 600 of the frequency-divided reference clock signal for two successive cycles 610: an initial cycle 610a for which the DLL 580 is not locked to frequency or phase; and a successive cycle 610b for which the DLL 580 locks onto frequency and phase in two stages. FIG. 19 also depicts a waveform 604 of the value of the phase tracker's counter and a waveform 608 of the above-mentioned frequency-divided output clock signal, which is provided by the frequency divider 588. At time $T_2$ on the rising, or positive, edge of the frequency-divided reference clock signal, the extrapolator 590 adjusts for frequency locking; and at time $T_3$ on the falling, or negative, edge of the frequency-divided output clock signal, the extrapolator 590 adjusts for a phase lock.

For this two stage control, there are two normalized control values: a normalized control value called "$C_i$," which is the normalized control value for the frequency correction; and a normalized control called "$C'_i$," which is the normalized control value for the phase correction. In these expressions, the index "i" represents the particular sequence of the normalized control value such as n−1, n, n+1, etc. Equating the time periods of the cycles 610a and 610b produces the following equation:

$$(2^{N-1}-A_{n-1})\cdot C_{n-1}+(2^{N-1}+A_n)\cdot C'_{n-1}=(2^{N-1}-A_n)\cdot C_n+ 2^{N-1}\cdot C'_n. \quad \text{Eq. 9}$$

Solving for produces the following:

$$C'_n = \frac{(2^{N-1}-A_{n-1})\cdot C_{n-1} + (2^{N-1}+A_n)\cdot C'_{n-1} - (2^{N-1}-A_n)\cdot C_n}{2^{N-1}}, \quad \text{Eq. 10}$$

and the frequency correction component $C_n$ may then be described as follows:

$$C_n = \frac{(2^{N-1}-A_{n-1})\cdot C_{n-1} + (2^{N-1}+A_n)\cdot C'_{n-1}}{2^N}. \quad \text{Eq. 11}$$

Similar to before, the numerators of Eqs. 10 and 11 are accumulations of the active control values, and the denominators of Eqs. 10 and 11 merely involve shift only operations.

It is noted that the phase correction is optional, and as such, only the $C_n$ normalized control value may be used, in accordance with some embodiments of the invention, with the phase correction not being used. Thus, in accordance with some embodiments of the invention, the DLL may operate only in a frequency-lock mode using the above-described two stage control estimation.

Figure 20:
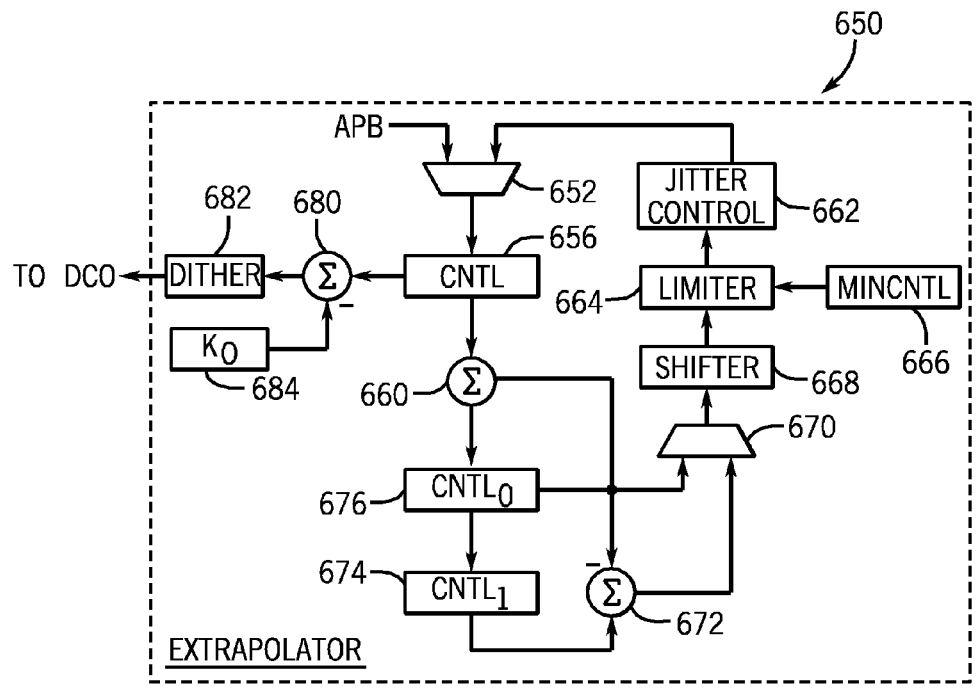
FIG. 20 is a schematic diagram of an extrapolator that uses the two stage control scheme according to an embodiment of the invention.

Referring to FIG. 20, in accordance with some embodiments of the invention, the extrapolator 590 may have an architecture 650. This architecture 650 includes a register 676 that accumulates the active normalized control value used for frequency correction and a register 674 that stores the previous accumulated normalized control value. The difference of the active and previous accumulations (obtained via an adder 672) may be used for phase correction. Thus, a multiplexer 670 of the architecture 650 selects either the active accumulated normalized control value stored by block 676 or the difference of the active and previous accumulations obtained via adder 672. The denominator value is calculated via a shifter 668 and limiter 664. Moreover, the limiter 664 limits the minimum normalized control value to a threshold value (MINCNTL) that is stored in a register 666. The result is received by jitter control 662, which limits the control steps when the DLL is locked. As also depicted in FIG. 20, a multiplexer 652 accepts either an initial value for the normalized control value, which is stored in a register 656 or the value provided from the jitter control 662. The normalized control value stored in the register 656 is then algebraically combined with the $K_0$ offset (stored in a register 684), and this result is then provided to dither control 682 before being provided to the DCO 360. In accordance with some embodiments of the invention, the dither control 682 improves the DCO resolution and output jitter by providing finer frequency control steps by allowing the control frequency to dither between two settings, as can be appreciated by the skilled artisan.

Figure 21:
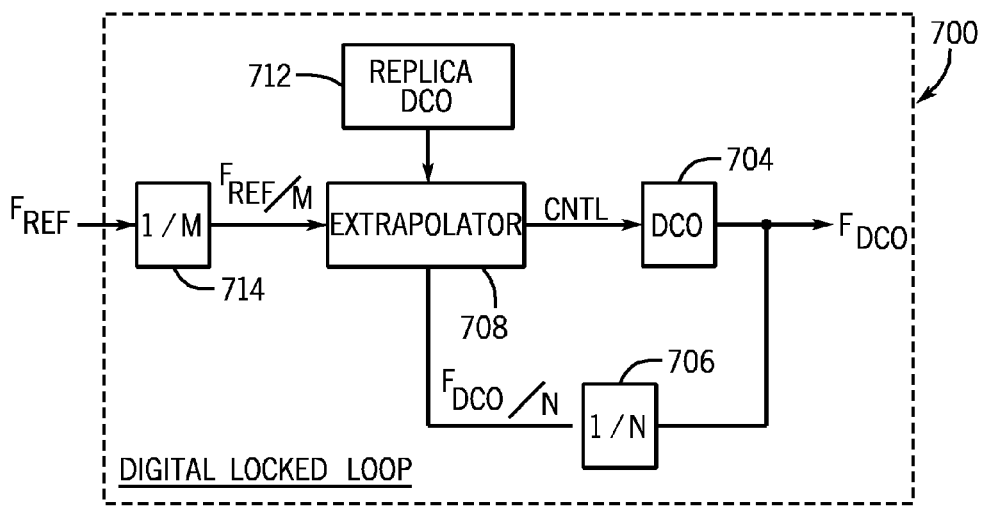

Referring to FIG. 21, in accordance with some embodiments of the invention, a DLL 700 may be used, which uses a replica DCO 712 in addition to a DCO 704 that provides the output clock signal. As a non-limiting example, the replica DCO 712 and the DCO 704 may have the same exact design. However, the DCO 712 may have a slightly different design than the DCO 704 and still be considered a replica. In this manner, in accordance with some embodiments of the invention, the replica DCO 712 may have a different design than the DCO 704 but have a transfer function that varies within ten percent of the transfer function of the DCO 704.

As depicted in FIG. 21, the DLL 700 also includes a frequency divider (a 1/N divider) 706, that provides a frequency-divided version of the output signal to an extrapolator 708. The DLL 700 also includes a frequency divider (a 1/M divider) 714, which provides a frequency-divided version of the reference clock signal to the extrapolator 708. The replica DCO 712 operates at a constant frequency and oversamples the reference clock signal.

Figure 22:
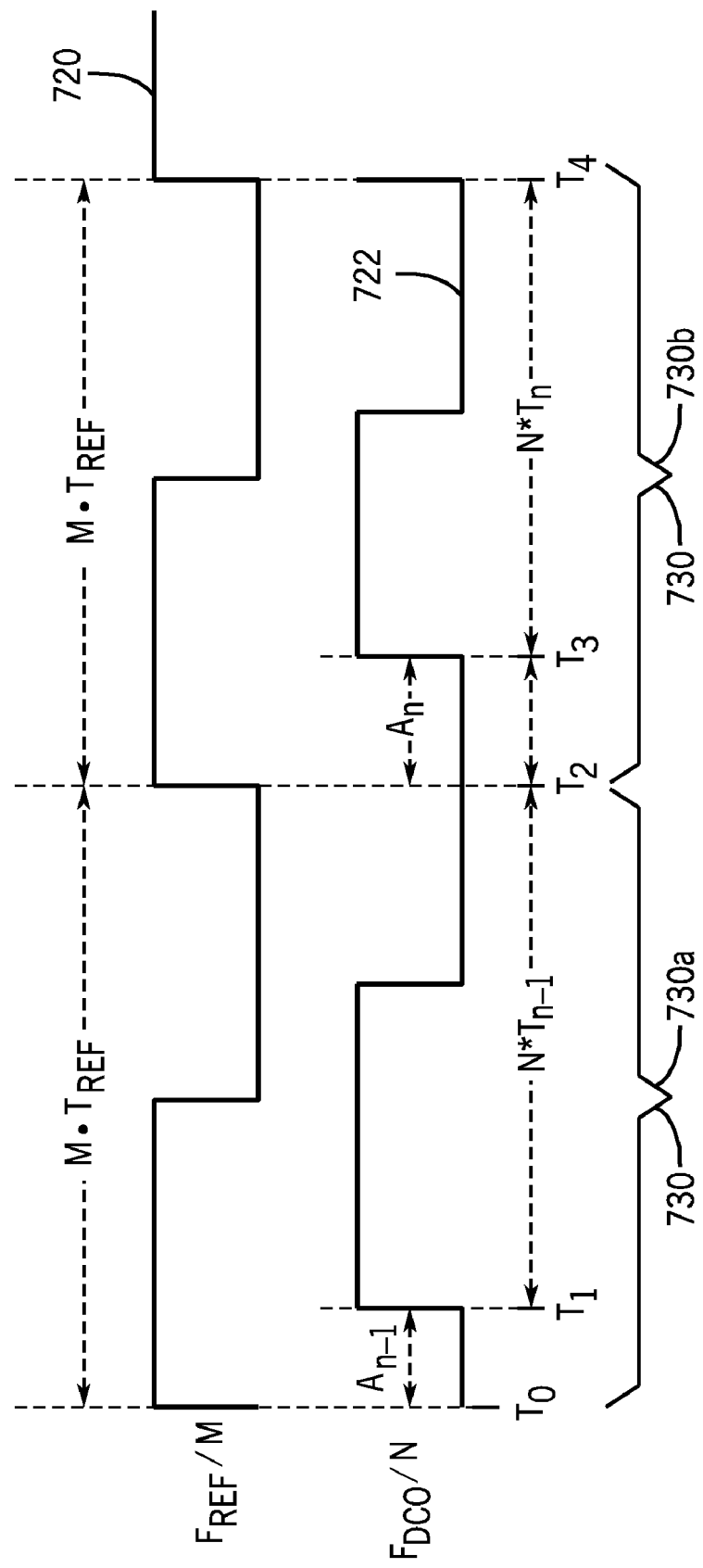
FIG. 22 illustrates waveforms associated with the digital locked loop of FIG. 21 according to an embodiment of the invention.

Referring to FIG. 22, the replica DCO 712 is used to count DCO cycles between positive edges of the frequency-divided reference and output clock signals. This is illustrated in FIG. 22, which depicts a waveform 720 of the frequency-divided reference clock signal and a waveform 722 of the frequency-divided output clock signal. In this manner, this example depicts two successive cycles 730 of the frequency-divided reference clock signal: an initial cycle 730a in which the DLL is unlocked and a successive cycle 730b in which locking is achieved. In cycle 730a, the positive going edge of the frequency-divided output clock signal leads the positive going edge of the frequency-divided reference clock signal by a count of $A_{n-1}$.

The extrapolator 708 (see FIG. 21) solves for the next control value by equating the periods of the cycle 730a and 730b, as set forth below:

$$A_{n-1} \cdot T_{OSC} + N \cdot T_{n-1} - A_n \cdot T_{OSC} = A_n \cdot T_{OSC} + N \cdot T_n, \quad \text{Eq. 12}$$

where "$T_{OSC}$" represents the replica DCO period; "$T_n$" represents the period of the output clock signal for which a corresponding control value is calculated; and "$T_{n-1}$" represents the period of the output clock signal in the previous cycle. Solving for the $T_n$ period results in the following:

$$T_n = T_{n-1} + \frac{(A_{n-1} - 2A_n) \cdot T_{OSC}}{N}, \quad \text{Eq. 13}$$

and the DCO generally has the following linear transfer function:

$$T_n = J_0 \cdot (CNTL_n + K_0), \quad \text{Eq. 14}$$

where "$J_0$" and "$K_0$" represent constants. Assuming that the replica DCO 712 is indeed an exact replica of the DCO 704, algebraic substitution produces the following result:

$$(CNTL_n + K_0) = \quad \text{Eq. 15}$$
$$(CNTL_{n-1} + K_0) + \frac{(A_{n-1} - 2A_n) \cdot (CNTL_{OSC} + K_0)}{N},$$

where "$(CNTL_n + K_0)$" is the CNTL control value used to drive the DCO 704.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
   storing a state of a frequency locked loop when an output signal of the frequency locked loop is substantially locked onto a reference signal, the storing comprising storing a representation of a value used to control an oscillator of the frequency locked loop; and
   subsequently initializing the frequency locked loop with the stored state to cause the frequency locked loop to substantially relock the output signal to the reference signal.

2. The method of claim 1, further comprising disabling operation of the frequency locked loop prior to the subsequent initialization of the frequency locked loop.

3. The method of claim 2, wherein the disabling is associated with a transition of the frequency locked loop into a power conservation state, the method further comprising:
   transitioning the frequency locked loop from the power conservation state into a higher power consumption state, comprising enabling operation of the frequency locked loop and performing the subsequent initialization of the frequency locked loop.

4. The method of claim 3, wherein the transitioning the frequency locked loop from the power conservation state into the higher power consumption state occurs in response to an operation of a radio.

5. The method of claim 1, wherein the state is one of a plurality of states of the frequency locked loop for when the frequency locked loop is substantially locked to cause the output signal to have one of a plurality of frequencies, and the operation of the frequency locked loop to substantially relock comprises operating the frequency locked loop to substantially lock the output signal based at least in part on the one of a plurality of states.

6. The method of claim 1, wherein the state comprises at least one of the following: a temperature sensitivity control value; a frequency control value; a period control value; a duty-cycle control value; and a supply voltage sensitivity control value.

7. The method of claim 1, further comprising sampling a value of a voltage controlled oscillator control value, wherein the storing comprises storing a representation of the sampled value of the voltage controlled oscillator control value.

8. The method of claim 1, wherein the value comprises a digital value used to control a digitally controlled oscillator.

9. The method of claim 1, wherein the operating to substantially relock occurs in response to changing a frequency of operation of the frequency locked loop to avoid interference in a transmission or reception processing path of a radio.

10. The method of claim 1, further comprising clocking a processor with the output signal of the frequency locked loop before the output signal is substantially locked to the reference signal.

11. An apparatus comprising:
    a frequency locked loop comprising an oscillator; and
    a controller to store a state of the frequency locked loop to cause the oscillator to substantially lock an output signal of the frequency locked loop onto a reference signal and subsequently initialize the frequency locked loop with the stored state such that the oscillator substantially relocks the output signal to the reference signal.

12. The apparatus of claim 11, wherein the controller is adapted to regulate the frequency locked loop to disable the frequency locked loop during a power conservation state and regulate the frequency locked loop to substantially relock onto the reference signal in response to a higher power management state.

13. The apparatus of claim 11, wherein the controller is adapted to disable the frequency locked loop in response to operation of a radio.

14. The apparatus of claim 11, wherein the state is one of a plurality of states of the frequency locked loop at which the frequency locked loop is substantially locked to cause the output signal to have one of a plurality of frequencies, and the controller is adapted to regulate the frequency locked loop to perform frequency hopping.

15. The apparatus of claim 11, wherein the state comprises at least one of the following: a temperature sensitivity control value; a frequency control value; a period control value; a duty-cycle control value; and a supply voltage sensitivity control value.

16. The apparatus of claim 11, wherein the controller is adapted to operate the frequency locked loop to avoid interference in a radio transmission or reception processing path.

17. The apparatus of claim 11, further comprising:
a processor adapted to be clocked by the output signal, wherein the processor is adapted to be clocked by the signal before the frequency locked loop substantially locks onto the reference signal.

18. An apparatus comprising:
an integrated circuit comprising a frequency locked loop comprising an oscillator, a memory, and a controller,
wherein the controller is adapted to store a state of the frequency locked loop to cause the oscillator to substantially lock an output signal of the frequency locked loop onto a reference signal and subsequently initialize the frequency locked loop with the stored state such that the oscillator substantially relocks the output signal onto the reference signal.

19. The apparatus of claim 18, wherein the frequency locked loop is adapted to subsequently regulate the output signal based in part on an operating state of the frequency locked loop and a transfer function of an oscillator which generates the output signal.

20. The apparatus of claim 18, wherein the integrated circuit further comprises a processor adapted to be clocked by the output signal, wherein the processor is adapted to be clocked by the signal before the frequency locked loop substantially locks onto the reference signal and the frequency locked loop is adapted to limit an upper frequency of the output signal.

21. A method comprising:
storing a state of a frequency locked loop when an output signal of the frequency locked loop is substantially locked onto a reference signal;
subsequently initializing the frequency locked loop with the stored state to cause the frequency locked loop to substantially relock the output signal to the reference signal; and
clocking a processor with the output signal of the frequency locked loop before the output signal is substantially locked to the reference signal.

22. An apparatus comprising:
a frequency locked loop;
a controller to store a state of the frequency locked loop for which an output signal of the frequency locked loop is substantially locked onto a reference signal and subsequently initialize the frequency locked loop with the stored state to cause the frequency locked loop to substantially relock the output signal to the reference signal; and
a processor adapted to be clocked by the output signal, wherein the processor is adapted to be clocked by the signal before the frequency locked loop substantially locks onto the reference signal.

* * * * *